US012563734B2

(12) United States Patent (10) Patent No.: US 12,563,734 B2
Lim et al. (45) Date of Patent: Feb. 24, 2026

(54) SEMICONDUCTOR DEVICES INCLUDING SEPARATE CHARGE STORAGE LAYERS

(71) Applicant: Samsung Electronics Co., Ltd., Suwon-si (KR)

(72) Inventors: Taisoo Lim, Seoul (KR); Suhyeong Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/581,049

(22) Filed: Feb. 19, 2024

(65) Prior Publication Data

US 2024/0237351 A1 Jul. 11, 2024

Related U.S. Application Data

(63) Continuation of application No. 16/854,189, filed on Apr. 21, 2020, now Pat. No. 11,937,425.

(30) Foreign Application Priority Data

Sep. 3, 2019 (KR) ........................ 10-2019-0108801

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/10* (2023.02); *H10B 41/27* (2023.02); *H10B 41/30* (2023.02);
(Continued)

(58) Field of Classification Search
CPC ........ H10B 41/27; H10B 41/30; H10B 43/27; H10B 43/30
See application file for complete search history.

(56) References Cited

U.S. PATENT DOCUMENTS 8,673,721 B2 3/2014 Toshiro et al.
8,877,590 B1 11/2014 Lee
(Continued)

FOREIGN PATENT DOCUMENTS

CN 109920793 B 7/2021
CN 106571368 B 1/2022
(Continued)

*Primary Examiner* — Yara B Green
*Assistant Examiner* — Christopher M Roland
(74) *Attorney, Agent, or Firm* — Wolf, Greenfield & Sacks, P.C.

(57) ABSTRACT

Semiconductor devices are provided. A semiconductor device includes gate electrodes on a substrate and stacked perpendicularly to an upper surface of the substrate. The semiconductor device includes interlayer insulating layers alternately stacked with the gate electrodes. Moreover, the semiconductor device includes channel structures passing through the gate electrodes. Each of the channel structures includes a channel layer extending perpendicularly to the upper surface of the substrate, a tunneling insulating layer on the channel layer, charge storage layers on the tunneling insulating layer in respective regions between the gate electrodes and a side surface of the tunneling insulating layer, and first blocking insulating layers on the charge storage layers, respectively. A first layer of the first blocking insulating layers is on an upper surface, a lower surface, and a side surface of a first layer of the charge storage layers.

20 Claims, 32 Drawing Sheets

100b 146 144 143a 142 140 150 CR

120

130

(51) Int. Cl.

| | |
|---|---|
| *H10B 41/27* | (2023.01) |
| *H10B 41/30* | (2023.01) |
| *H10B 43/10* | (2023.01) |
| *H10B 43/30* | (2023.01) |
| *H10D 30/68* | (2025.01) |
| *H10D 30/69* | (2025.01) |

(52) U.S. Cl.

CPC ............. *H10B 43/10* (2023.02); *H10B 43/30* (2023.02); *H10D 30/689* (2025.01); *H10D 30/6891* (2025.01); *H10D 30/693* (2025.01); *H10D 30/694* (2025.01)

(56) References Cited

U.S. PATENT DOCUMENTS

| | | | |
|---|---|---|---|
| 9,230,979 B1 | 1/2016 | Pachamuthu et al. | |
| 9,373,628 B2 | 6/2016 | Sohn et al. | |
| 9,397,093 B2 | 7/2016 | Makala et al. | |
| 9,484,353 B1 | 11/2016 | Lai et al. | |
| 9,659,955 B1 | 5/2017 | Sharangpani et al. | |
| 9,711,523 B2 | 7/2017 | Lee et al. | |
| 9,754,956 B2 | 9/2017 | Tsutsumi et al. | |
| 9,768,270 B2 | 9/2017 | Gunji-Yoneoka et al. | |
| 9,978,768 B2 | 5/2018 | Xu et al. | |
| 10,700,078 B1* | 6/2020 | Cui ........................ | H10B 41/27 |
| 11,177,280 B1 | 11/2021 | Rajashekhar et al. | |
| 2011/0147824 A1 | 6/2011 | Son et al. | |
| 2012/0001249 A1 | 1/2012 | Alsmeier et al. | |
| 2014/0160841 A1 | 6/2014 | Koval | |
| 2015/0155297 A1 | 6/2015 | Eom et al. | |
| 2016/0043093 A1 | 2/2016 | Lee et al. | |
| 2016/0071861 A1 | 3/2016 | Serov et al. | |
| 2016/0315092 A1 | 10/2016 | Higuchi et al. | |
| 2017/0103997 A1 | 4/2017 | Lee et al. | |
| 2017/0250189 A1 | 8/2017 | Itokawa | |
| 2017/0352671 A1 | 12/2017 | Kato et al. | |
| 2018/0151588 A1 | 5/2018 | Tsutsumi et al. | |
| 2019/0043960 A1 | 2/2019 | Koval et al. | |
| 2019/0139983 A1 | 5/2019 | Lee et al. | |
| 2020/0266202 A1 | 8/2020 | Kwon et al. | |
| 2020/0295035 A1* | 9/2020 | Sawa ..................... | H10B 41/10 |
| 2021/0066343 A1 | 3/2021 | Choi et al. | |

FOREIGN PATENT DOCUMENTS

| | | |
|---|---|---|
| KR | 20150001999 A | 1/2015 |
| KR | 20190053013 A | 5/2019 |

* cited by examiner

B

190

110
120
101

SEMICONDUCTOR DEVICES INCLUDING SEPARATE CHARGE STORAGE LAYERS

CROSS-REFERENCE TO RELATED APPLICATION(S)

This application is a continuation application of U.S. patent application Ser. No. 16/854,189, filed on Apr. 21, 2020, which claims the benefit of priority to Korean Patent Application No. 10-2019-0108801, filed on Sep. 3, 2019, in the Korean Intellectual Property Office, the disclosure of each of which is hereby incorporated herein by reference in their entirety.

BACKGROUND

The present disclosure relates to semiconductor devices. Semiconductor devices may have a relatively high capacity of data processing, even while their volumes are becoming smaller. Therefore, it may be desirable to increase the degree of integration of the semiconductor elements constituting such semiconductor devices. Therefore, as one method of improving the degree of integration of semiconductor devices, semiconductor devices having vertical transistor structures, instead of conventional planar transistor structures, have been proposed.

SUMMARY

An aspect of the present inventive concept is to provide a semiconductor device having improved reliability.

According to some embodiments of the present inventive concept, a semiconductor device may include gate electrodes spaced apart from each other on a substrate and stacked perpendicularly to an upper surface of the substrate. The semiconductor device may include interlayer insulating layers alternately stacked with the gate electrodes on the substrate. Moreover, the semiconductor device may include channel structures passing through the gate electrodes and extending perpendicularly to the upper surface of the substrate. Each of the channel structures may include a channel layer extending perpendicularly to the upper surface of the substrate, a tunneling insulating layer on the channel layer and extending perpendicularly to the upper surface of the substrate, charge storage layers on the tunneling insulating layer in respective regions between the gate electrodes and a side surface of the tunneling insulating layer, and first blocking insulating layers on the charge storage layers, respectively. A first layer of the first blocking insulating layers may be on an upper surface and a lower surface of a first layer of the charge storage layers, and may further be on a side surface of the first layer of the charge storage layers facing a first electrode of the gate electrodes. A height of each of the charge storage layers may be less than a distance between a pair of the interlayer insulating layers that are adjacent to each other, in a direction perpendicular to the upper surface of the substrate.

According to some embodiments of the present inventive concept, a semiconductor device may include gate electrodes spaced apart from each other on a substrate and stacked perpendicularly to an upper surface of the substrate. The semiconductor device may include interlayer insulating layers alternately stacked with the gate electrodes on the substrate. Moreover, the semiconductor device may include channel structures passing through the gate electrodes and extending perpendicularly to the upper surface of the substrate. Each of the channel structures may include a tunneling insulating layer and a channel layer extending perpendicularly to the upper surface of the substrate, and charge storage layers and blocking insulating layers on side surfaces of the gate electrodes and between the side surfaces of the gate electrodes and the tunneling insulating layer. A first layer of the charge storage layers and a first layer of the blocking insulating layers may be separated from a second layer of the charge storage layers and a second layer of the blocking insulating layers by a first layer of the interlayer insulating layers. The blocking insulating layers, together with the tunneling insulating layer, may completely surround the charge storage layers, respectively. Moreover, upper and lower surfaces of the blocking insulating layers may be in contact with the interlayer insulating layers.

According to some embodiments of the present inventive concept, a semiconductor device may include gate electrodes spaced apart from each other on a substrate and stacked perpendicularly to an upper surface of the substrate. The semiconductor device may include interlayer insulating layers alternately stacked with the gate electrodes on the substrate. The semiconductor device may include a channel layer passing through the gate electrodes and extending perpendicularly to the upper surface of the substrate. The semiconductor device may include a tunneling insulating layer between side surfaces of the interlayer insulating layers and the channel layer and extending perpendicularly to the upper surface of the substrate. The semiconductor device may include charge storage layers between the gate electrodes, respectively, and the tunneling insulating layer. A first layer of the charge storage layers may be between a side surface of a first electrode of the gate electrodes and a side surface of the tunneling insulating layer, and between a pair of the interlayer insulating layers that are adjacent to each other in a vertical direction. The semiconductor device may include first blocking insulating layers on the charge storage layers, respectively. A first layer of the first blocking insulating layers may be an upper surface and a lower surface of a first layer of the charge storage layers and may be on a side surface of the first layer of the charge storage layers facing the side surface of the first electrode of the gate electrodes, and may be between the pair of the interlayer insulating layers that are adjacent to each other in the vertical direction. Moreover, the semiconductor device may include second blocking insulating layers on the gate electrodes, respectively. A first layer of the second blocking insulating layers may be on an upper surface, a lower surface, and the side surface of the first electrode of the gate electrodes, and may have an upper surface substantially coplanar with an upper surface of the first layer of the first blocking insulating layers.

According to some embodiments of the present inventive concept, a method of manufacturing a semiconductor device includes alternately stacking horizontal sacrificial layers and interlayer insulating layers on a substrate to form a stack structure; forming channel holes passing through the horizontal sacrificial layers and the interlayer insulating layers; removing a portion of the horizontal sacrificial layers exposed through the channel holes to form recess regions; filling first and second vertical sacrificial layers in sequence to fill the recess regions in the channel holes; oxidizing a portion of the second vertical sacrificial layers from the channel holes to form oxidized sacrificial layers; removing the oxidized sacrificial layers and a portion of the first vertical sacrificial layers to expose side surfaces of the interlayer insulating layers; nitriding remaining unoxidized second vertical sacrificial layers to form charge storage layers; forming tunneling insulating layers and channel layers in the channel holes in sequence; forming an opening passing through the horizontal sacrificial layers and the interlayer insulating layers; removing the horizontal sacrificial layers through the openings to form lateral openings; removing the oxidized sacrificial layers exposed by the lateral openings; and forming a blocking insulating layer on the charge storage layers exposed by the lateral openings.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
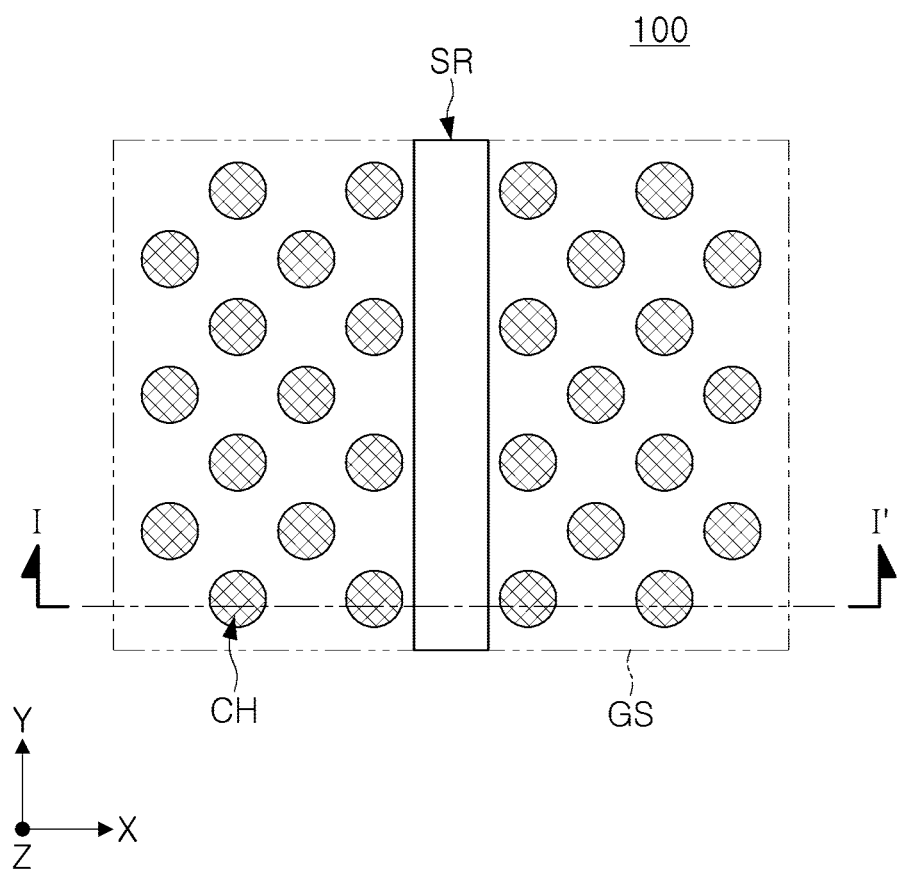
FIG. 1 is a plan view schematically illustrating a semiconductor device according to an example embodiment.

FIG. 1 is a plan view schematically illustrating a semiconductor device according to an example embodiment.

Figure 2:
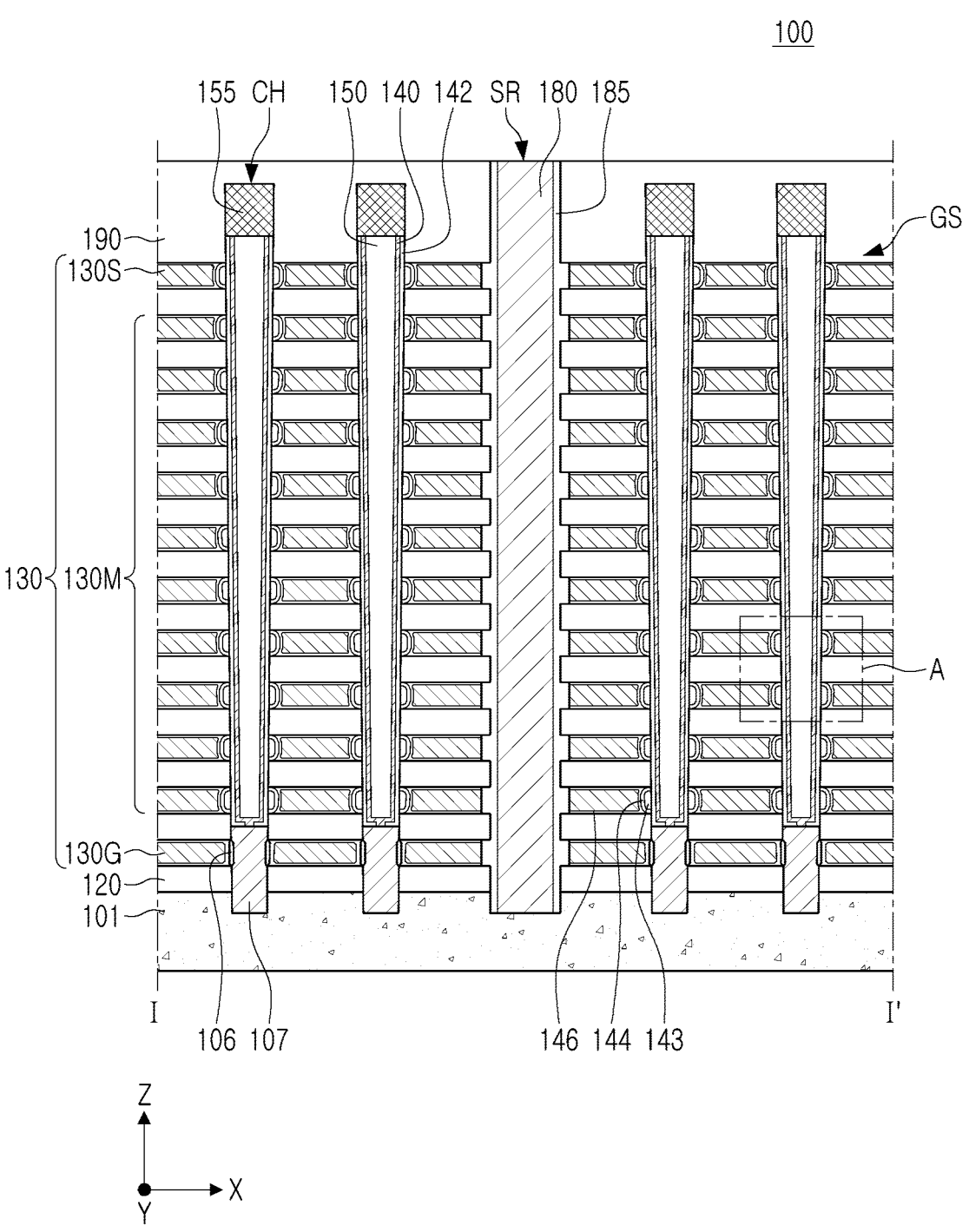
FIG. 2 is a cross-sectional view schematically illustrating a semiconductor device according to an example embodiment.

FIG. 2 is a cross-sectional view schematically illustrating a semiconductor device according to an example embodiment. FIG. 2 illustrates a cross-section taken along cross-section line I-I' of FIG. 1.

Figure 3:
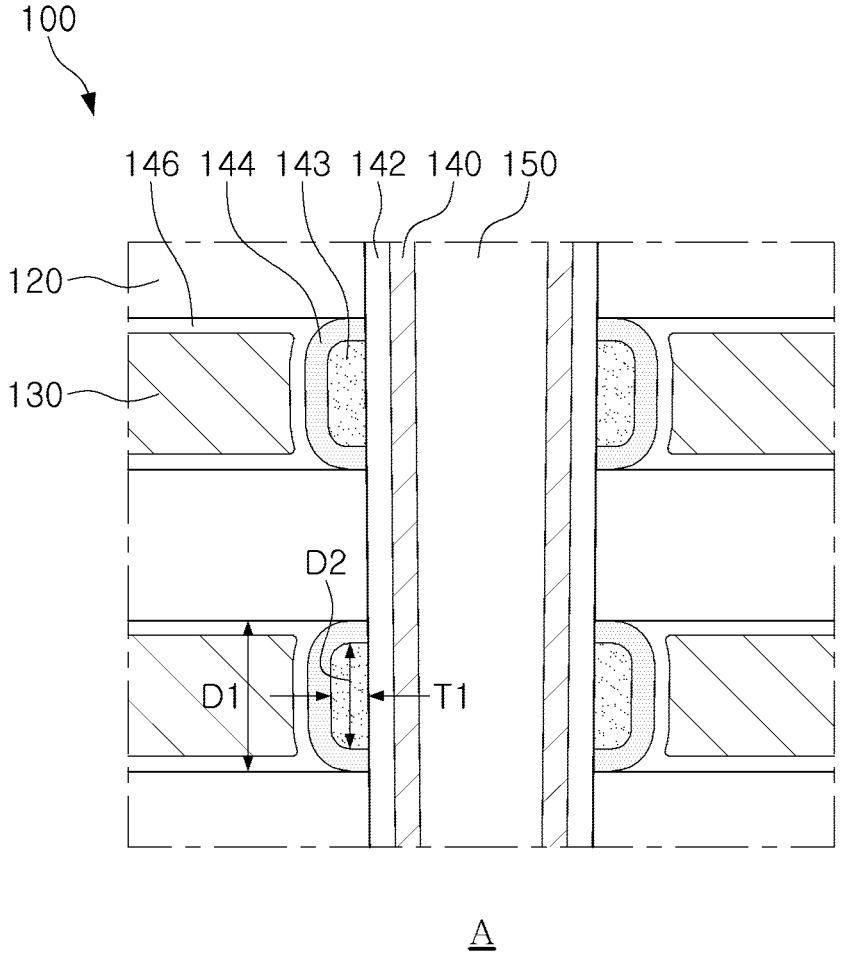
FIG. 3 is a partially enlarged view schematically illustrating a semiconductor device according to an example embodiment.

FIG. 3 is a partially enlarged view schematically illustrating a semiconductor device according to an example embodiment. In FIG. 3, an enlarged view of portion 'A' of FIG. 2 is illustrated.

Referring to FIGS. 1 to 3, a semiconductor device 100 may include a substrate 101, gate electrodes 130 spaced apart from each other on the substrate 101 and stacked perpendicularly to the substrate 101, interlayer insulating layers 120 alternately stacked with the gate electrodes 130, channel structures CH passing through the gate electrodes 130, extending in a direction perpendicular to an upper surface of the substrate 101, and having a channel layer 140 disposed therein, and separation regions SR extending into and passing through a stack structure GS of the interlayer insulating layers 120 and the gate electrodes 130.

Each of the channel structures CH may include a tunneling insulating layer 142, charge storage layers 143, and first blocking insulating layers 144, sequentially stacked on/from the channel layer 140, and may further include a channel insulating layer 150 between opposing sidewalls of the channel layer 140, a channel pad 155 in an upper end of the channel structure CH, and an epitaxial layer 107 disposed below the channel layer 140. In addition, the semiconductor device 100 may further include source conductive layers 180 and separation insulating layers 185 arranged in the separation regions SR, and second blocking insulating layers 146 surrounding at least a portion of the gate electrodes 130.

In the semiconductor device 100, a memory cell string may be configured around each channel layer 140, and a plurality of memory cell strings may be arranged in rows and columns in an x direction and a y direction.

The substrate 101 may have an upper surface extending in the x direction and the y direction. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The gate electrodes 130 may be stacked to be vertically spaced apart on the substrate 101 to form the stack structure GS together with the interlayer insulating layers 120. The gate electrodes 130 may include a lower gate electrode 130G that forms a gate of a ground select transistor, memory gate electrodes 130M that constitute a plurality of memory cells, and an upper gate electrode 130S that forms a gate of a string select transistor. The number of memory gate electrodes 130M constituting the memory cells may vary (e.g., may be determined), depending on capacity of the semiconductor device 100. According to an example embodiment, the upper gate electrode 130S and the lower gate electrode 130G respectively constituting the string select transistor and the ground select transistor may each be one, two, or more gate electrodes, and may have the same structure as or a different structure from the memory gate electrodes 130M constituting the memory cells. A portion of the gate electrodes 130, for example, the memory gate electrodes 130M adjacent to the upper or lower gate electrodes 130S and 130G may be dummy gate electrodes.

The gate electrodes 130 may be stacked to be vertically spaced apart from each other on the substrate 101, and may be disposed to be separated from each other in the x direction by the separation regions SR extending in the y direction. The gate electrodes 130 between a pair of separation regions SR may form a memory block, but a range of the memory block is not limited thereto. A portion of the gate electrodes 130, for example, the memory gate electrodes 130M may form a single layer in one memory block.

The gate electrodes 130 may include a metal material, such as tungsten (W). In some embodiments, the gate electrodes 130 may include polycrystalline silicon or a metal silicide material. In example embodiments, the gate electrodes 130 may further include a diffusion barrier on an outside thereof. For example, the diffusion barrier may include tungsten nitride (WN), tantalum nitride (TaN), titanium nitride (TiN), or a combination thereof.

The interlayer insulating layers 120 may be disposed between the gate electrodes 130. In a similar manner to the gate electrodes 130, the interlayer insulating layers 120 may be disposed to be spaced apart from each other in a direction perpendicular to the upper surface of the substrate 101. The interlayer insulating layers 120 may include an insulating material such as silicon oxide or silicon nitride. The interlayer insulating layers 120 may have substantially planar upper and lower surfaces. Side surfaces of the interlayer insulating layers 120 may have a structure protruding horizontally beyond side surfaces of the gate electrodes 130 toward the separation region SR. In an example embodiment, the side surfaces of the interlayer insulating layers 120 may be coplanar with the side surfaces of the gate electrodes 130 in/adjacent the separation region SR.

The channel structures CH may each form one memory cell string, and may be disposed to be spaced apart from each other in rows and columns on the substrate 101. The channel structures CH may be arranged to form a grid, or may be arranged in a zigzag form in a direction. The channel structures CH may have a pillar (or other elongated vertical) shape, and may have an inclined side such that a width narrows closer to the substrate 101 according to an aspect ratio. Each of the channel structures CH may include the channel layer 140, the tunneling insulating layer 142, the charge storage layers 143, the first blocking insulating layers 144, the channel insulating layer 150, the channel pad 155, and the epitaxial layer 107. For example, in the present specification, the channel structure CH may be used as a term including not only pillar-shaped regions, but also the charge storage layers 143 and the first blocking insulating layers 144, which may be components surrounding regions outside the pillar-shaped regions. The tunneling insulating layer 142, the charge storage layers 143, and the first blocking insulating layers 144 of the channel structure CH may form a gate dielectric layer together with the second blocking insulating layers 146.

The channel layer 140 may be formed to have an annular shape surrounding the channel insulating layer 150, but according to an example embodiment, the channel layer 140 may have a pillar shape such as a cylinder or a prismatic pillar without the channel insulating layer 150. A lower portion of the channel layer 140 may be connected to the epitaxial layer 107. The channel layer 140 may include a semiconductor material such as polycrystalline silicon or single crystal silicon, and the semiconductor material may be an undoped material or a material including p-type or n-type impurities. The channel structures CH arranged in a straight line in the x direction between a pair of separation regions SR may be respectively connected to different bit lines, according to an arrangement of an upper wiring structure connected to the channel pad 155.

The tunneling insulating layer 142 may be disposed between the side surfaces of the interlayer insulating layers 120 and the channel layer 140 on the channel layer 140, may extend perpendicularly to the upper surface of the substrate 101, and may be arranged as a single layer in a single channel layer CH. The tunneling insulating layer 142 may tunnel a charge to the charge storage layers 143, and may include, for example, silicon oxide ($SiO_2$), silicon nitride ($Si_3N_4$), silicon oxynitride (SiON), or a combination thereof.

The charge storage layers 143 may be disposed on the tunneling insulating layer 142, and the gate electrodes 130 may be disposed in regions recessed in an outward direction from the channel structure CH. The charge storage layers 143 may be disposed between the interlayer insulating layers 120 adjacent to each other in a vertical direction, to overlap the interlayer insulating layers 120 in the plan view or in the z direction. Therefore, the charge storage layers 143 may be disposed to be separated from each other between the gate electrodes 130 adjacent to each other in a vertical direction (e.g., separated from each other by the interlayer insulating layers 120), and may be disposed to be separated into a plurality of layers in one channel structure CH. As illustrated in FIG. 3, a surface of the charge storage layers 143 not contacting the tunneling insulating layer 142 may have a convex rounded shape toward the gate electrodes 130. The degree to which this shape is rounded may variously vary according to some embodiments. Each of the charge storage layers 143 may have a structure completely surrounded by the tunneling insulating layer 142 and the first blocking insulating layer 144. The charge storage layers 143 may be a charge trap layer or a floating gate conductive layer, and may be formed of silicon nitride, when the charge storage layers 143 comprise a charge trap layer.

Each of the charge storage layers 143 has a height (i.e., a vertical thickness) D2, shorter than a distance D1 between the interlayer insulating layers 120 that may be vertically adjacent to each other in a direction perpendicular to the upper surface of the substrate 101, e.g., in the z direction. This is because the charge storage layer 143 may be disposed to be surrounded by the first blocking insulating layer 144 between the interlayer insulating layers 120 adjacent to each other. In addition, the height D2 of the charge storage layer 143 may be shorter than a height of one of the gate electrodes 130. A thickness T1 of the charge storage layer 143 in the x direction may be in a range of about 4 nanometers (nm) to about 6 nm, for example. The thickness range of the charge storage layer 143 may be determined in consideration of a relative relationship with thicknesses of other layers in the vicinity, magnitude of a voltage applied to the gate electrode 130, and the like.

The first blocking insulating layers 144 may be disposed on the charge storage layers 143 and between the second blocking insulating layers 146 and the charge storage layers 143. Each of the first blocking insulating layers 144 may be disposed on (e.g., to surround/cover) an upper surface and a lower surface of the charge storage layer 143, and may be disposed on (e.g., to surround/cover) an external side surface of the charge storage layer 143 facing the gate electrode 130. For example, the first blocking insulating layer 144 may be disposed to surround all surfaces other than surfaces in which the charge storage layer 143 contacts the tunneling insulating layer 142. In a similar manner to the charge storage layers 143, the first blocking insulating layers 144 may be disposed to be separated from each other between the gate electrodes 130 adjacent to each other in a vertical direction. The first blocking insulating layers 144 may be confined by and disposed only between the interlayer insulating layers 120 to overlap the interlayer insulating layers 120 in the z direction. The first blocking insulating layers 144 may not extend vertically in the z direction on side surfaces of the interlayer insulating layers 120.

Upper and lower surfaces of the first blocking insulating layers 144 may be respectively in contact with the interlayer insulating layers 120 adjacent thereto. Inner side surfaces of the first blocking insulating layers 144 may be in contact with the charge storage layers 143, and external side surfaces of the first blocking insulating layers 144 may be in contact with the second blocking insulating layers 146. The inner side surfaces and the external side surfaces of the first blocking insulating layers 144 may have convex rounded shapes toward the gate electrodes 130. On the upper and lower surfaces of the charge storage layers 143, inner side surfaces of the first blocking insulating layers 144 at upper and lower ends may be in contact with the tunneling insulating layer 142, and may be substantially coplanar with inner side surfaces of the charge storage layers 143. In addition, the upper and lower surfaces of the first blocking insulating layers 144 may be substantially coplanar with upper and lower surfaces of the second blocking insulating layers 146, respectively.

The second blocking insulating layers 146 may be disposed on external side surfaces of the first blocking insulating layers 144, e.g., one side of the first blocking insulating layers 144 facing the gate electrodes 130 instead of facing the channel structures CH, and may extend horizontally along the gate electrodes 130. Each of the second blocking insulating layers 146 may surround upper, lower, and side surfaces of the gate electrode 130. External side surfaces of the second blocking insulating layers 146 that contact the first blocking insulating layers 144 may have shapes concavely rounded toward the channel layer 140.

The first blocking insulating layers 144 and the second blocking insulating layers 146 may include silicon oxide ($SiO_2$), silicon nitride ($Si_3N_4$), silicon oxynitride (SiON), a high-k dielectric material, or combinations thereof. In this case, the high-k dielectric material refers to a dielectric material having a dielectric constant higher than that of silicon oxide ($SiO_2$). The high-k dielectric material may include, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), praseodymium oxide ($Pr_2O_3$), or a combination thereof. The first blocking insulating layers 144 and the second blocking insulating layers 146 may include different materials. For example, the first blocking insulating layers 144 may include silicon oxide ($SiO_2$), and the second blocking insulating layers 146 may include aluminum oxide ($Al_2O_3$). In an example embodiment, the interlayer insulating layers 120, the tunneling insulating layer 142, and the first blocking insulating layers 144 may include the same material.

In the semiconductor device, the charge storage layers 143 of (e.g., constituting) the gate dielectric layer may be disposed separately from each other between the gate electrodes 130 adjacent to each other in a vertical direction, thereby inhibiting/preventing deterioration of electrical characteristics such as degradation in retention characteristics due to charge spreading. In addition, as the charge storage layers 143 are formed using an improved/optimized manufacturing process, the first blocking insulating layers 144 may be disposed to surround the charge storage layers 143.

The channel pad 155 may be disposed to cover an upper surface of the channel insulating layer 150 and to be electrically connected to the channel layer 140. The channel pad 155 may include, for example, doped polycrystalline silicon.

The epitaxial layer 107 may be disposed on the substrate 101 at the lower end of the channel structure CH, and disposed on the side surface of the at least one gate electrode 130. A side insulating layer 106 may be further disposed between the epitaxial layer 107 and the gate electrode 130. The epitaxial layer 107 may be disposed in a recessed region of the substrate 101. An upper surface of the epitaxial layer 107 may be higher than an upper surface of a lowermost gate electrode 130, and may be lower than a lower surface of a gate electrode 130 on the lowermost gate electrode 130, but is not limited thereto. In example embodiments, the epitaxial layer 107 may be omitted. In this case, the channel layer 140 may be directly connected to the substrate 101, or may be connected to another conductive layer on the substrate 101.

The separation regions SR may pass through the gate electrodes 130 and the interlayer insulating layers 120 between the channel layers 140, may extend in the y direction, and may be connected to the substrate 101. The source conductive layers 180 and the separation insulating layers 185 may be arranged in the separation regions SR. The source conductive layer 180 may have a shape in which a width thereof decreases toward the substrate 101 due to a high aspect ratio, but is not limited thereto. In example embodiments, the source conductive layer 180 may have a side surface, perpendicular to the upper surface of the substrate 101.

The source conductive layer 180 may be electrically insulated from the gate electrodes 130 by the separation insulating layer 185. Therefore, the gate electrodes 130 in the stack structure GS may be separated from each other in the x direction, with the source conductive layer 180 interposed therebetween. The source conductive layer 180 may be disposed in a linear shape extending in the y direction, and may correspond to a common source line of the semiconductor device 100. The source conductive layer 180 may be arranged, for example, every four to eight columns of the channel layer 140 in the x direction, but is not limited thereto. The separation insulating layer 185 may be partially expanded and protruded between the interlayer insulating layers 120 to contact the side surfaces of the gate electrodes 130. The source conductive layer 180 may include a conductive material such as polysilicon, metal, or the like, and the separation insulating layer 185 may include an insulating material such as silicon oxide, silicon nitride, or the like. In some embodiments, the source conductive layer 180 may be omitted from the separation regions SR, and only an insulating material may be filled in the separation regions SR. In this case, a region corresponding to the common source line may be located in or on the substrate 101.

A cell region insulating layer 190 may be disposed on the stack structure GS of the gate electrodes 130, and may include an insulating material such as silicon oxide, silicon nitride, or the like.

Figure 4A:
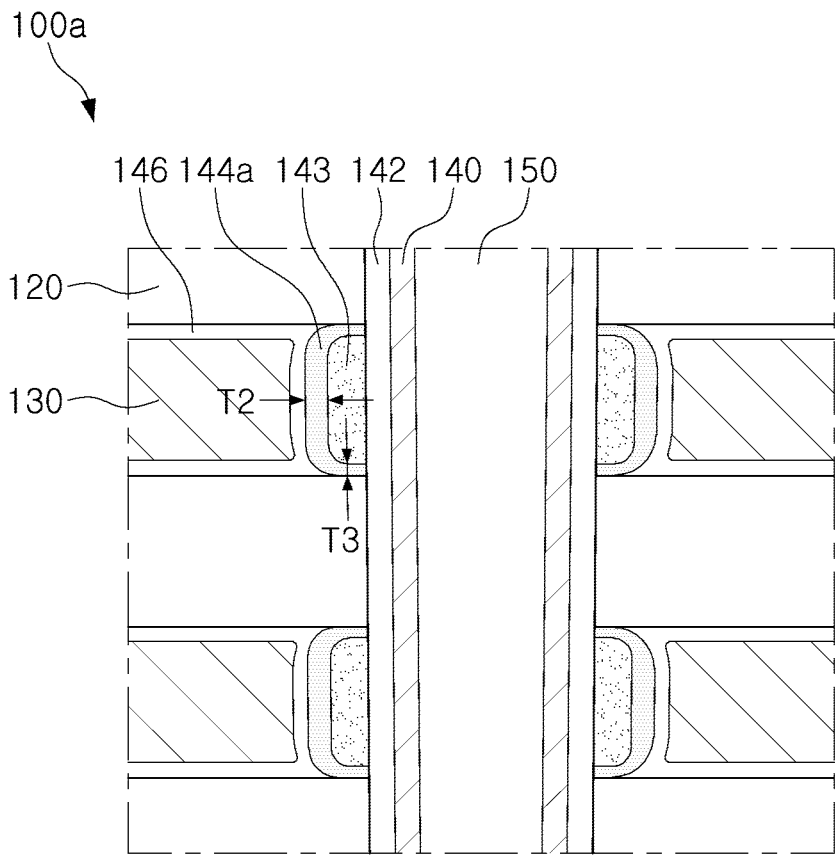
FIGS. 4A to 4C are partially enlarged views of a semiconductor device according to an example embodiment.
Figure 4B:
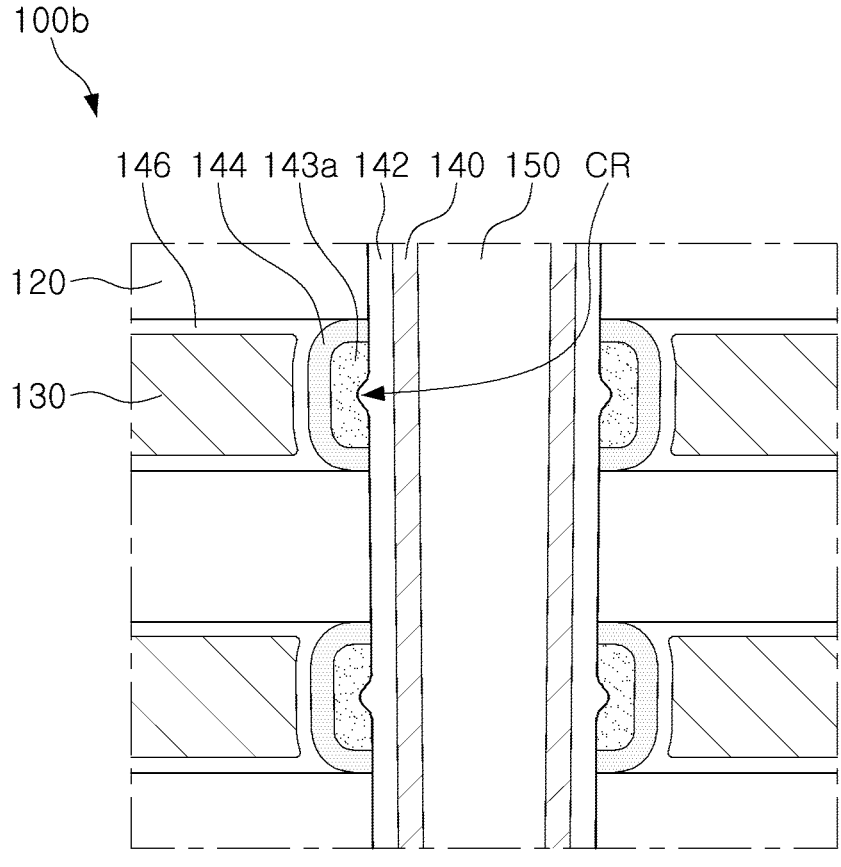
Figure 4C:
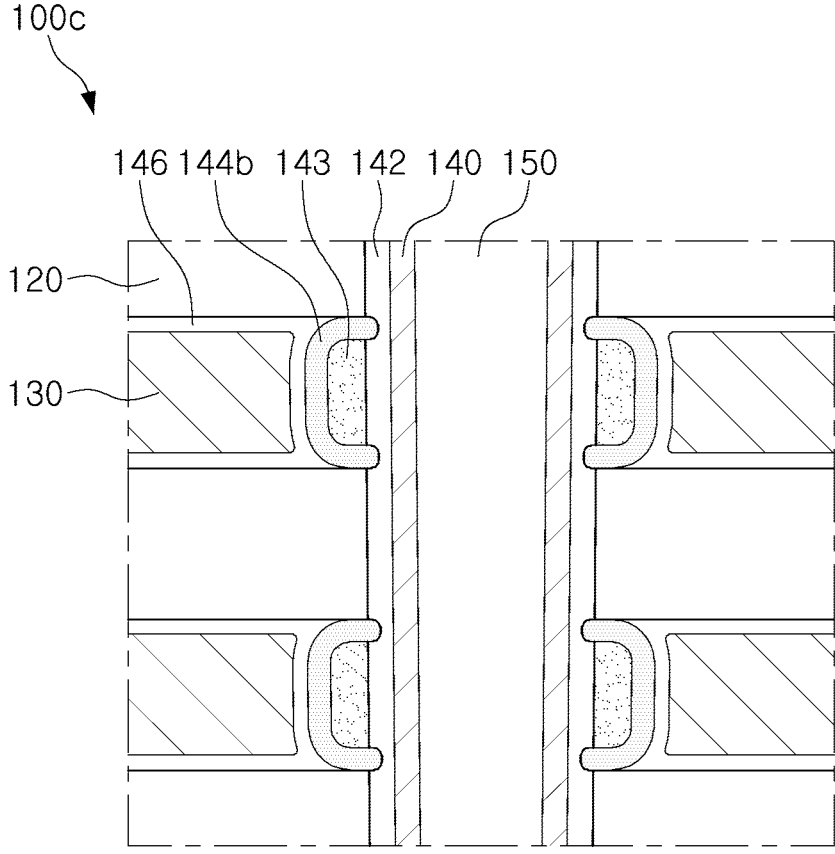

FIGS. 4A to 4C are partially enlarged views of a semiconductor device according to an example embodiment. FIGS. 4A to 4C are enlarged views of regions corresponding to portion 'A' of FIG. 2.

Referring to FIG. 4A, in a semiconductor device 100a, a first blocking insulating layer 144a may have different thicknesses on an upper surface, a lower surface, and an external side surface of a charge storage layer 143. In the first blocking insulating layer 144a, a thickness T2 on the external side surface of the charge storage layer 143 may be thicker than a thickness T3 on the upper and lower surfaces of the charge storage layer 143. Such a structure may be formed along a space between the charge storage layer 143 and interlayer insulating layers 120 in the process of forming the first blocking insulating layer 144a.

Referring to FIG. 4B, in a semiconductor device 100b, a charge storage layer 143a may have a recessed portion CR on an inner side surface of the charge storage layer 143a contacting a tunneling insulating layer 142. The recessed portion CR may be formed in a central region of the charge storage layer 143a in the vertical direction, and may have a concave shape toward a central portion of the charge storage layer 143a. In some embodiments, the tunneling insulating layer 142 may also have a recessed portion in a region corresponding to the recessed portion CR of the charge storage layer 143a. In this case, the recessed portion of the tunneling insulating layer 142 may have a more relaxed shape than the recessed portion CR of the charge storage layer 143a. Such a structure may be formed in this way, according to a depth of a recess during a recess forming process of a horizontal sacrificial layer 110 described below with reference to FIG. 11C.

Referring to FIG. 4C, in a semiconductor device 100c, inner side surfaces at upper and lower ends of a first blocking insulating layer 144b may not be coplanar with an inner side surface of a charge storage layer 143, and the first blocking insulating layer 144b may have a shape partially extending into a tunneling insulating layer 142. For example, the first blocking insulating layer 144b may be configured that inner side end portions of the first blocking insulating layer 144b protrude toward and into the tunneling insulating layer 142 on upper and lower surfaces of the charge storage layer 143. Such a structure may be formed in this manner, in a case in which a corresponding region of the tunneling insulating layer 142 is partially removed during a removing process of a first vertical sacrificial layer 115 described below with reference to FIG. 11J, before the forming process of the first blocking insulating layer 144b.

Figure 5A:
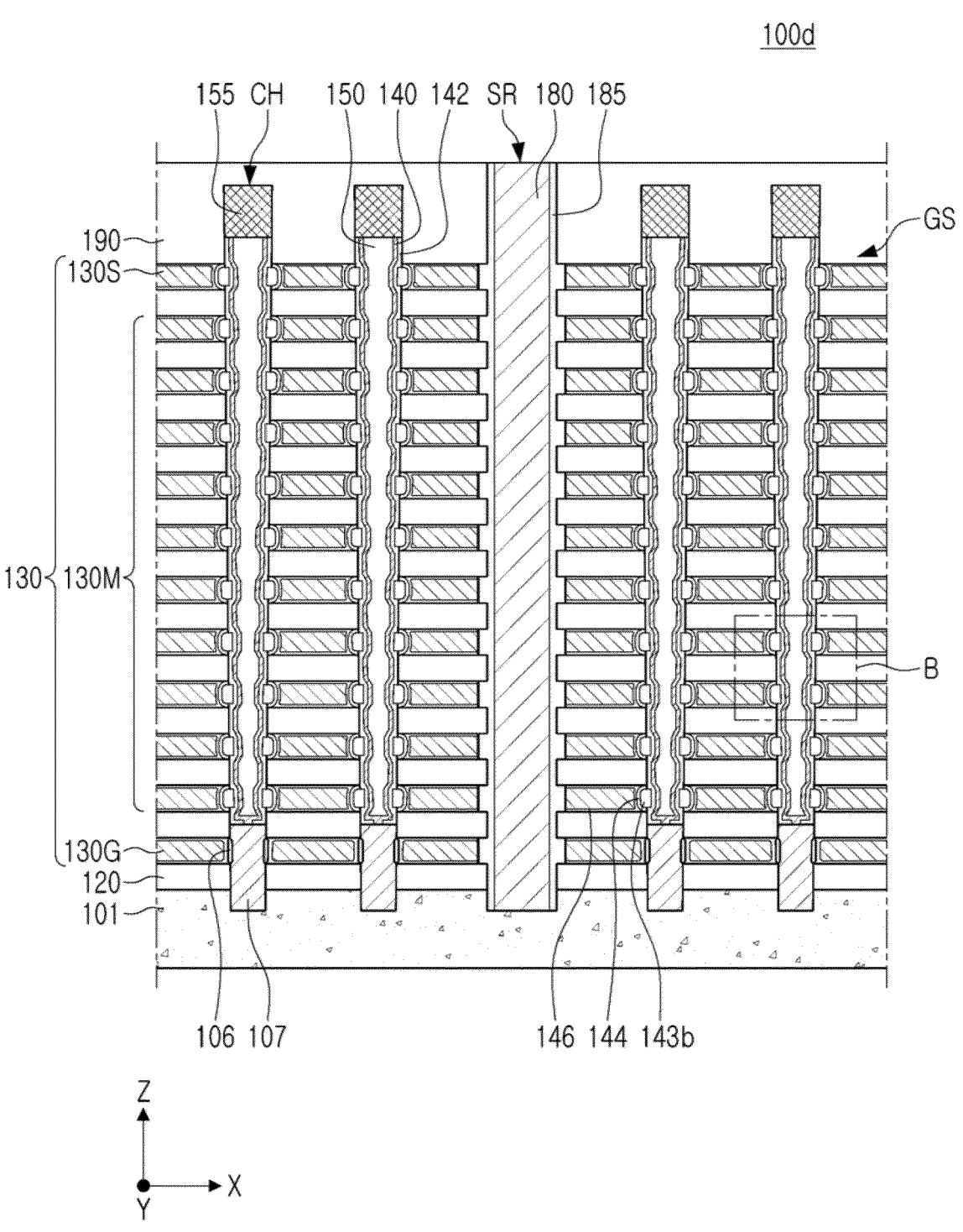
FIGS. 5A and 5B are a cross-sectional view and a partially enlarged view, respectively, schematically illustrating a semiconductor device according to an example embodiment.
Figure 5B:
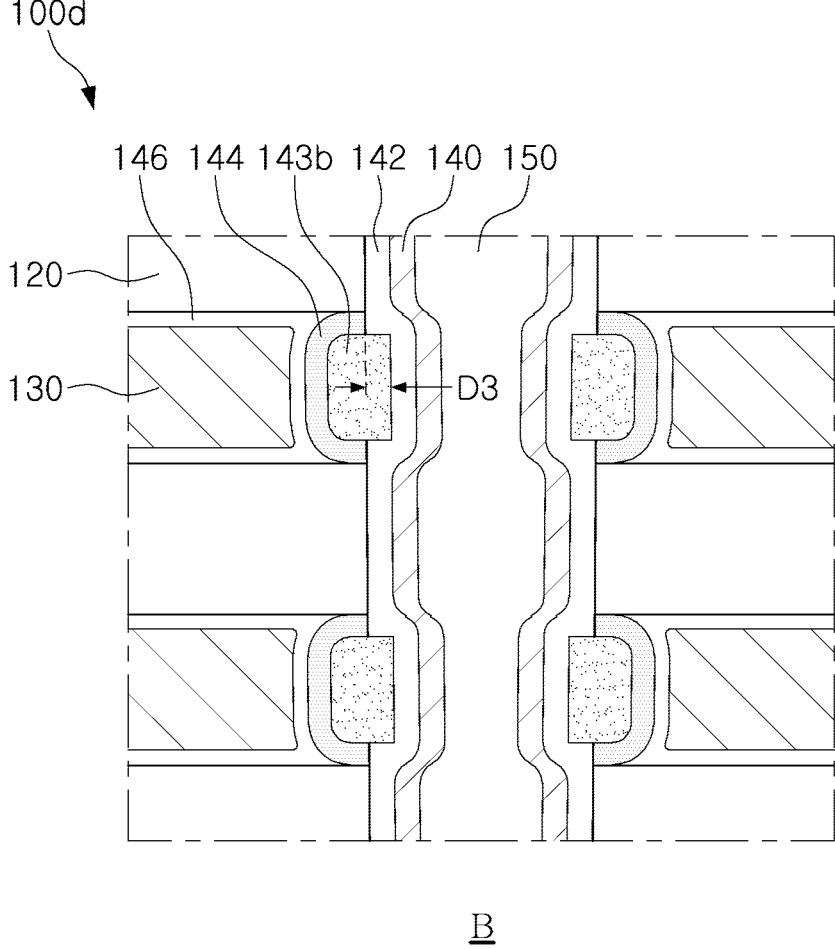

FIGS. 5A and 5B are a cross-sectional view and a partially enlarged view, respectively, schematically illustrating a semiconductor device according to an example embodiment. FIG. 5B is an enlarged view of portion 'B' of FIG. 5A.

Referring to FIGS. 5A and 5B, in a semiconductor device 100d, inner side surfaces of charge storage layers 143b are not coplanar with side surfaces of interlayer insulating layers 120, and the charge storage layers 143b may have a structure protruding toward central portions of channel structures CH (e.g., toward the channel layer 140). A length D3 of a portion of the charge storage layers 143b protruding horizontally in the x direction beyond the side surfaces of the interlayer insulating layers 120 may be, for example, less than half of a total thickness of the charge storage layers 143b in the x direction, but may be variously changed in some embodiments. A tunneling insulating layer 142 may surround the protruding regions of the charge storage layers 143b, and may extend perpendicularly to an upper surface of a substrate 101. Therefore, the tunneling insulating layer 142 may have a curvature corresponding to the arrangement of the charge storage layers 143b. In addition, a channel layer 140 may also accordingly have a curvature corresponding to the arrangement of the charge storage layers 143b.

Such a structure may be formed in this way, in a case in which the interlayer insulating layers 120 and a first vertical sacrificial layer 115 are partially removed above and below the charge storage layers 143b during a removing process of oxidized sacrificial layers 118 described below with reference to FIG. 11F.

Figure 6A:
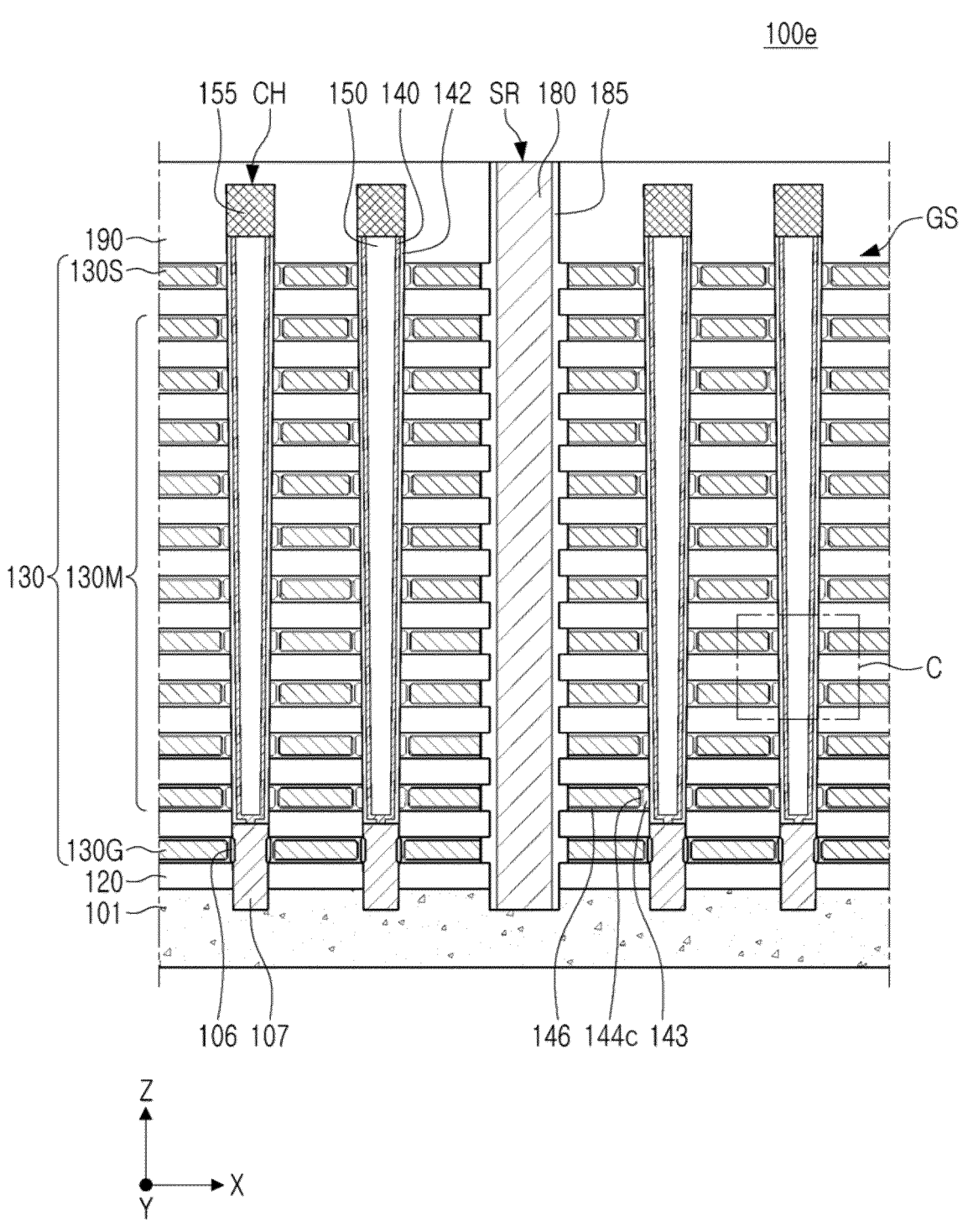
FIGS. 6A and 6B are a cross-sectional view and a partially enlarged view, respectively, schematically illustrating a semiconductor device according to an example embodiment.
Figure 6B:
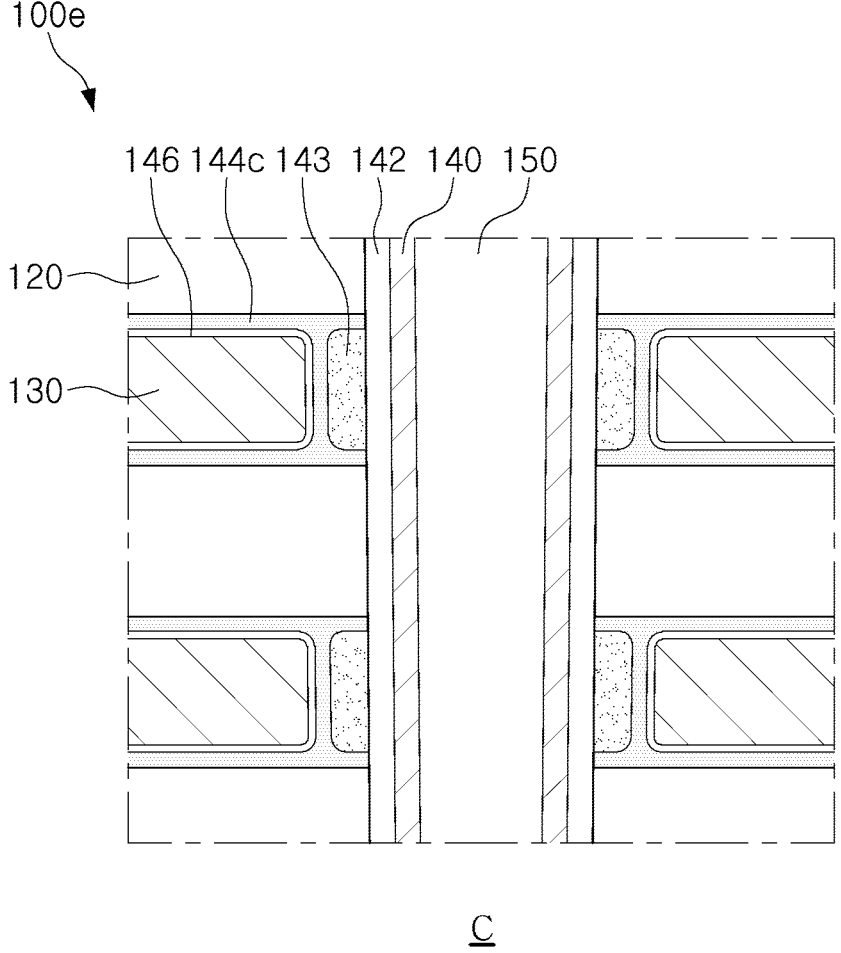

FIGS. 6A and 6B are a cross-sectional view and a partially enlarged view, respectively, schematically illustrating a semiconductor device according to an example embodiment. FIG. 6B is an enlarged view of portion 'C' of FIG. 6A.

Referring to 6A and 6B, in a semiconductor device 100e, first blocking insulating layers 144c may be not limited to be disposed between gate electrodes 130 and charge storage layers 143, and may be disposed to extend horizontally along the gate electrodes 130. Therefore, the first blocking insulating layers 144c may be disposed to surround the charge storage layers 143 in regions adjacent to channel layers 140, and may be disposed to surround the gate electrodes 130 and second blocking insulating layers 146. In this case, upper and lower surfaces of the first blocking insulating layers 144c may be in contact with interlayer insulating layers 120. In particular, inner side surfaces of the first blocking insulating layers 144c, e.g., side surfaces of the first blocking insulating layers 144c contacting the charge storage layers 143 may have convex rounded shapes toward the gate electrodes 130, and external side surfaces of the first blocking insulating layers 144c, e.g., side surfaces of the first blocking insulating layers 144c contacting the second blocking insulating layers 146, may have convex rounded shapes toward the channel layer 140. In addition, side surfaces of the second blocking insulating layers 146 facing the channel layer 140, e.g., side surfaces of the second blocking insulating layers 146 contacting the first blocking insulating layers 144c may have a convex rounded shape toward the channel layer 140.

Such a structure of the first blocking insulating layers 144c may be formed, in a case in which the first blocking insulating layers 144c are formed by a deposition process instead of an oxidation process, during a formation of the first blocking insulating layers 144c described below with reference to FIG. 11K.

Figure 7:
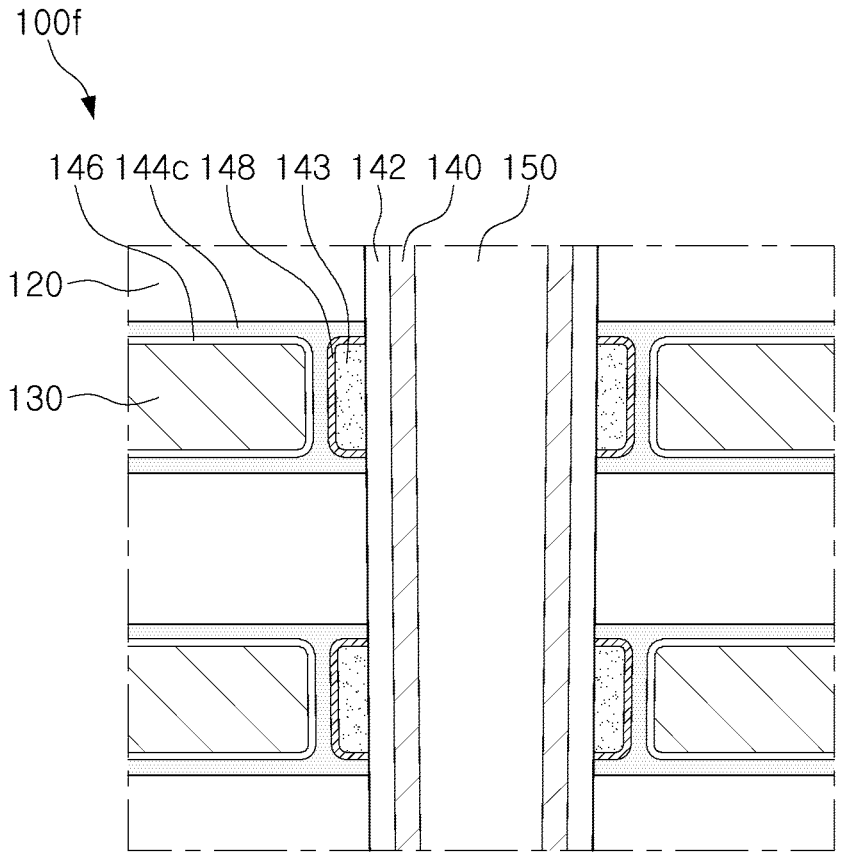
FIG. 7 is a partially enlarged view schematically illustrating a semiconductor device according to an example embodiment.

FIG. 7 is a partially enlarged view schematically illustrating a semiconductor device according to an example embodiment. FIG. 7 is an enlarged view of a region corresponding to portion 'C' of FIG. 6A.

Referring to FIG. 7, in a semiconductor device 100f, a first blocking insulating layer 144c may have a structure extending horizontally along gate electrodes 130, in a similar manner to those described above with reference to FIGS. 6A and 6B. In particular, the semiconductor device 100f may further include a third blocking insulating layer 148 disposed between a charge storage layer 143 and the first blocking insulating layer 144c.

The third blocking insulating layer 148 may include a material different from the first blocking insulating layer 144c and a second blocking insulating layer 146. Although a thickness of the third blocking insulating layer 148 is illustrated as being thinner than a thickness of the first blocking insulating layer 144c, the thicknesses are not limited thereto, and may be variously changed according to some embodiments. For example, the thickness of the third blocking insulating layer 148 may be thicker than the thickness of the first blocking insulating layer 144c. When the third blocking insulating layer 148 is included as described above, according to some embodiments, the second blocking insulating layer 146 may be omitted.

Figure 8:
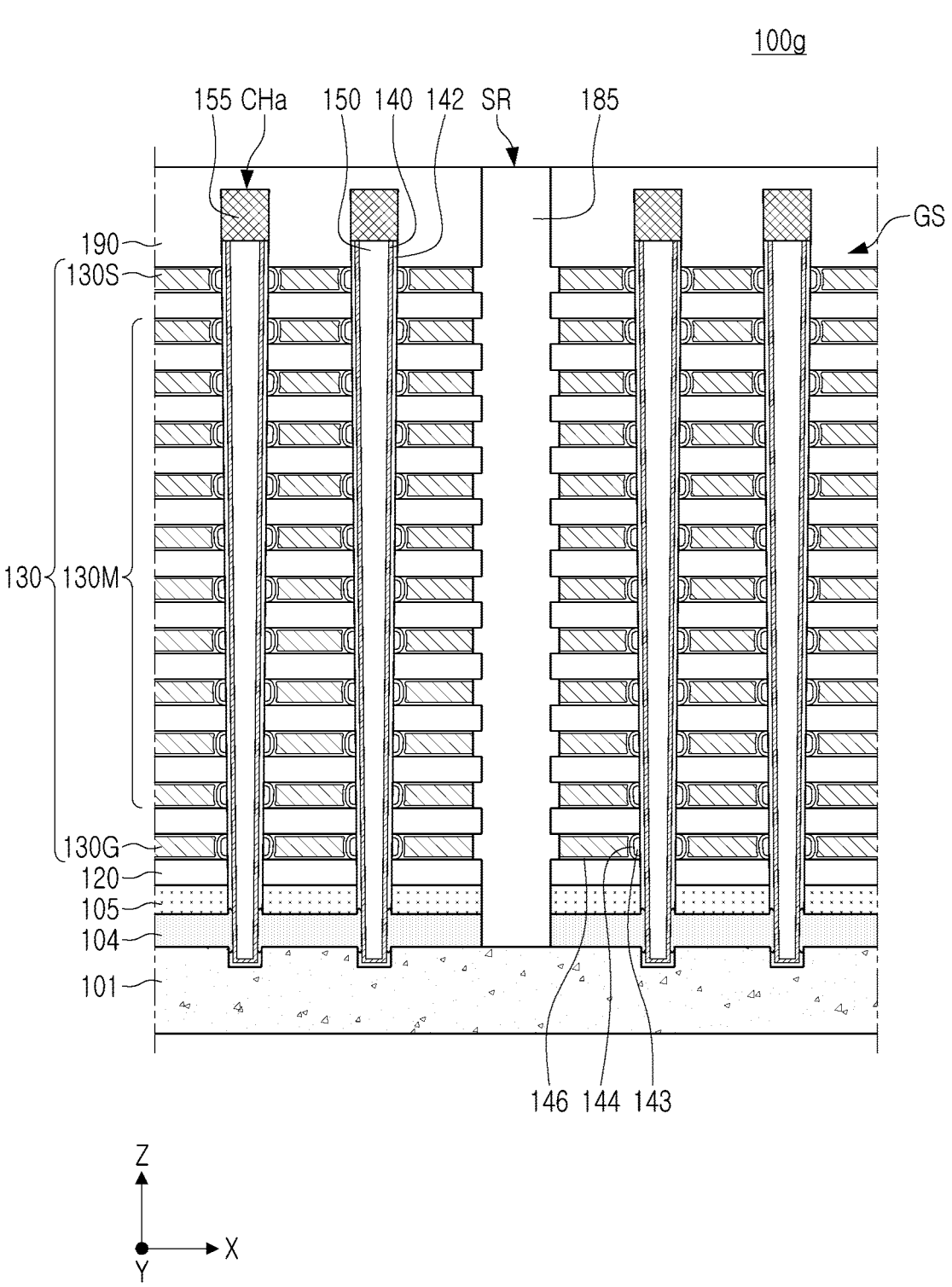
FIG. 8 is a cross-sectional view schematically illustrating a semiconductor device according to an example embodiment.

FIG. 8 is a cross-sectional view schematically illustrating a semiconductor device according to an example embodiment.

Referring to FIG. 8, in a semiconductor device 100g, in a different manner to the semiconductor device 100 of FIG. 2, channel structures CHa may not include an epitaxial layer 107, and the semiconductor device 100g may further include first and second conductive layers 104 and 105 disposed between a substrate 101 and an interlayer insulating layer 120. In addition, a separation region SR may be filled only with a separation insulating layer 185.

The first and second conductive layers 104 and 105 may be arranged to be stacked on an upper surface of the substrate 101. At least a portion of the first and second conductive layers 104 and 105 may function as a common source line of the semiconductor device 100g, or may function as a common source line of the semiconductor device 100g together with the substrate 101. The first conductive layer 104 may be directly connected to a channel layer 140 around the channel structures CHa. The first and second conductive layers 104 and 105 may include a semiconductor material, for example, polycrystalline silicon. In this case, at least the first conductive layer 104 may be a doped layer, and the second conductive layer 105 may be a doped layer or may be a layer including impurities diffused from the first conductive layer 104.

In the channel structures CHa, the channel layer 140 and a tunneling insulating layer 142 may be arranged to extend into the substrate 101. A portion of the tunneling insulating layer 142 may be removed from a lower end, and the first conductive layer 104 may be connected to the channel layer 140 in a region from which the tunneling insulating layer 142 is removed. As such, a shape of the common source line including the first and second conductive layers 104 and 105 may be applied to the embodiments of FIGS. 4A to 7.

Figure 9:
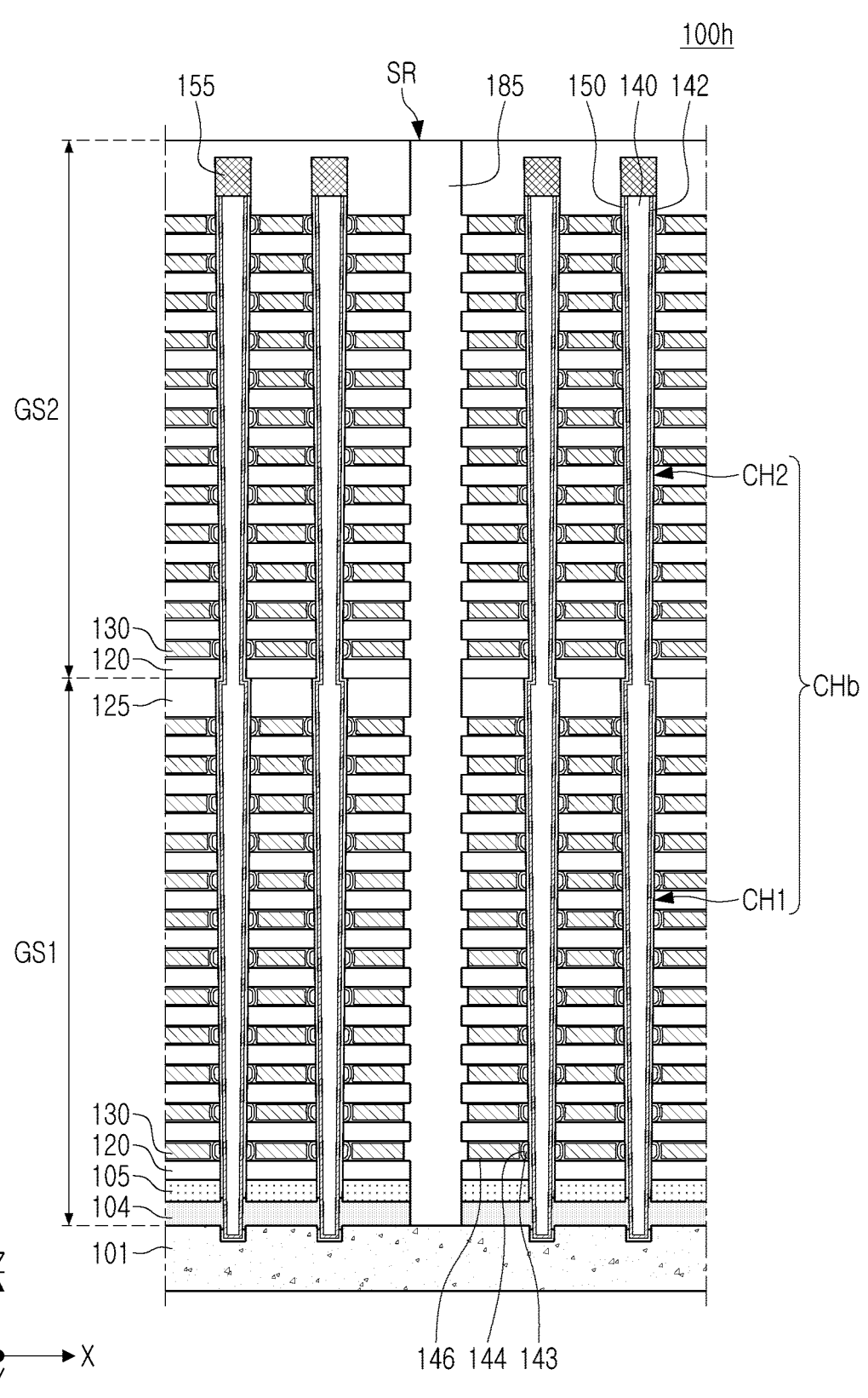
FIG. 9 is a cross-sectional view schematically illustrating a semiconductor device according to an example embodiment.

FIG. 9 is a cross-sectional view schematically illustrating a semiconductor device according to an example embodiment.

Referring to FIG. 9, in a semiconductor device 100h, a stack structure of gate electrodes 130 may include first and second stack structures GS1 and GS2, stacked in a vertical direction, and a channel structure CHb may include first and second channel structures CH1 and CH2, stacked in a vertical direction. A structure of the channel structure CHb may be introduced to stably form the channel structures CHb when the number of gate electrodes 130 stacked is relatively large.

The channel structure CHb may have a form in which the first channel structure CH1 of the first stack structure GS1 and the second channel structure CH2 of the second stack structure GS2 are connected to each other, and may have a bent portion by a difference in width of a region connected to each other. A channel layer 140, a tunneling insulating layer 142, and a channel insulating layer 150 may be connected to each other between the first channel structure CH1 and the second channel structure CH2. A channel pad 155 may be disposed only at an upper end of the second channel structure CH2 in an upper portion. In example embodiments, each of the first channel structure CH1 and the second channel structure CH2 may include the channel pad 155. In this case, the channel pad 155 of the first channel structure CH1 may be connected to the channel layer 140 of the second channel structure CH2. The semiconductor device 100h may include first and second conductive layers 104 and 105 as in the embodiment of FIG. 8, but is not limited thereto. For example, instead of the first and second conductive layers 104 and 105, the semiconductor device 100h may further include an epitaxial layer 107 disposed at a lower end of the channel structure CHb, as in the embodiment of FIG. 2.

A relatively thick upper interlayer insulating layer 125 may be disposed on an uppermost portion of the first stack structure GS1. Shapes of interlayer insulating layers 120 and the upper interlayer insulating layer 125 may be variously changed in some embodiments. For other elements/configurations, the description described above with reference to FIGS. 1 to 3 may be equally applied.

Figure 10:
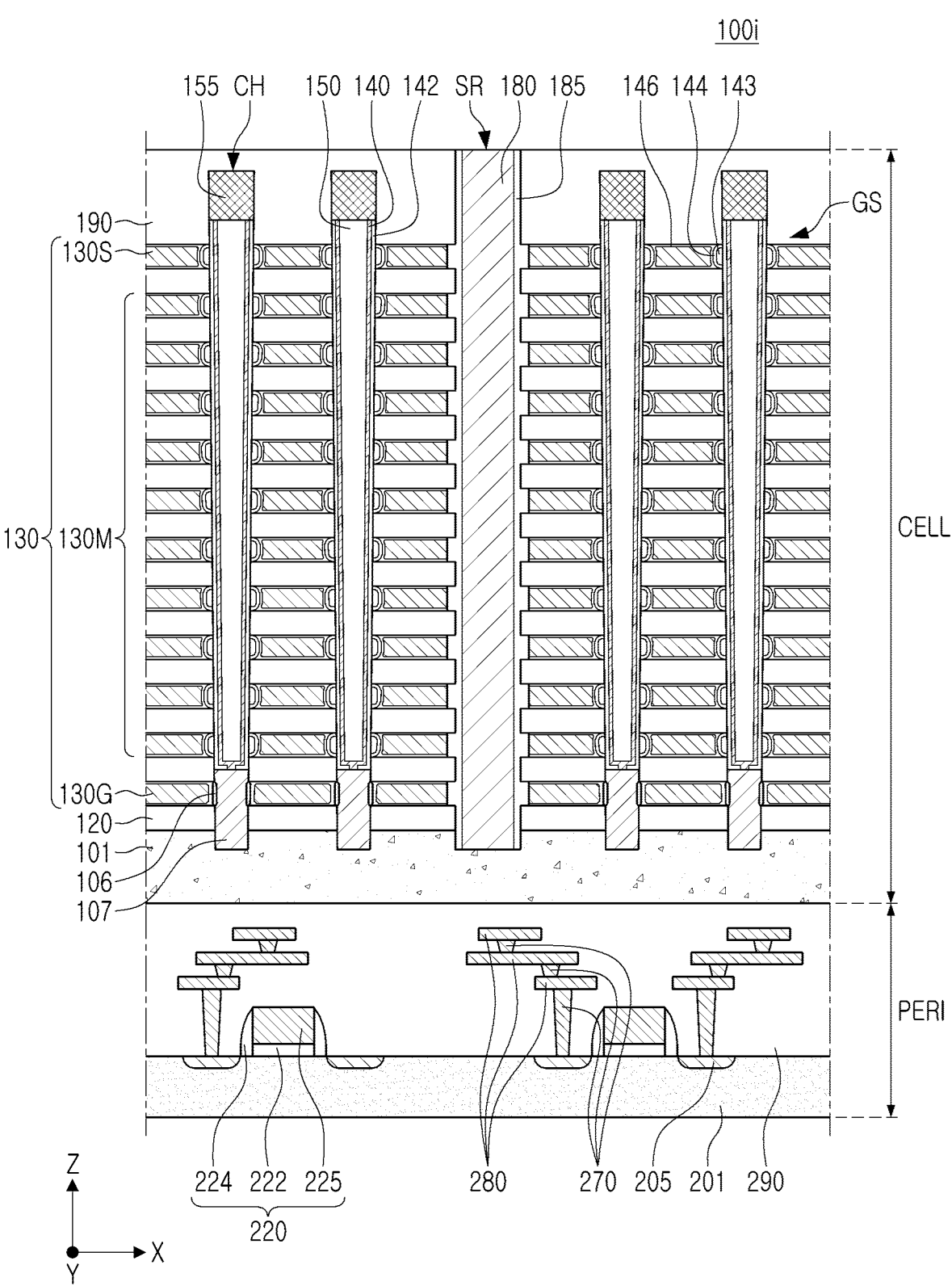
FIG. 10 is a cross-sectional view schematically illustrating a semiconductor device according to an example embodiment.

FIG. 10 is a cross-sectional view schematically illustrating a semiconductor device according to an example embodiment.

Referring to FIG. 10, a semiconductor device 100i may include a memory cell region CELL and a peripheral circuit region PERI, stacked in a vertical direction. The memory cell region CELL may be disposed on the peripheral circuit region PERI. For example, while, in the case of the semiconductor device 100 of FIG. 2, a peripheral circuit region PERI may be disposed on the substrate 101 in a region not illustrated, in this example embodiment, the memory cell region CELL and the peripheral circuit region PERI may be stacked in the vertical direction. In an example embodiment, the memory cell region CELL may be disposed below the peripheral circuit region PERI. For the memory cell region CELL, the description described above with reference to FIGS. 1 to 3 may be equally applied.

The peripheral circuit region PERI may include a base substrate 201, and circuit elements 220, circuit contact plugs 270, and circuit wiring lines 280, arranged on the base substrate 201.

The base substrate 201 may have an upper surface extending in the x direction and the y direction. In the base substrate 201, element isolation layers may be separately formed to define an active region. Source/drain regions 205 including impurities may be disposed in a portion of the active region. The base substrate 201 may include a semiconductor material, such as a group IV semiconductor, a group III-V compound semiconductor, or a group II-VI compound semiconductor.

The circuit elements 220 may include a planar transistor. Each of the circuit elements 220 may include a circuit gate dielectric layer 222, a spacer layer 224, and a circuit gate electrode 225. Source/drain regions 205 may be disposed in the base substrate 201 and at both (e.g., opposite) sides of the circuit gate electrode 225.

A peripheral region insulating layer 290 may be disposed on the circuit elements 220 on the base substrate 201. The circuit contact plugs 270 may pass through the peripheral region insulating layer 290 to be connected to the source/drain regions 205. Electrical signals may be applied to the circuit elements 220 by the circuit contact plugs 270. In a region not illustrated, the circuit contact plugs 270 may also be connected to the circuit gate electrode 225. The circuit wiring lines 280 may be connected to the circuit contact plugs 270, and may be disposed as a plurality of layers.

In the semiconductor device 100i, the peripheral circuit region PERI may be first manufactured. Thereafter, the substrate 101 of the memory cell region CELL may be formed thereon to manufacture the memory cell region CELL. The substrate 101 may have the same size as the base substrate 201 or may be formed smaller than the base substrate 201. The memory cell region CELL and the peripheral circuit region PERI may be connected to each other in a region not illustrated. For example, one or more ends of gate electrodes 130 in the y direction may be electrically connected to the circuit elements 220. Such a configuration in which the memory cell region CELL and the peripheral circuit region PERI are stacked in the vertical direction may be applied to the embodiments of FIGS. 4A to 9.

FIGS. 11A to 11L are cross-sectional views schematically illustrating a method of manufacturing a semiconductor device according to an example embodiment. FIGS. 11A to 11L illustrate cross-sections corresponding to FIG. 2.

Figure 11A:
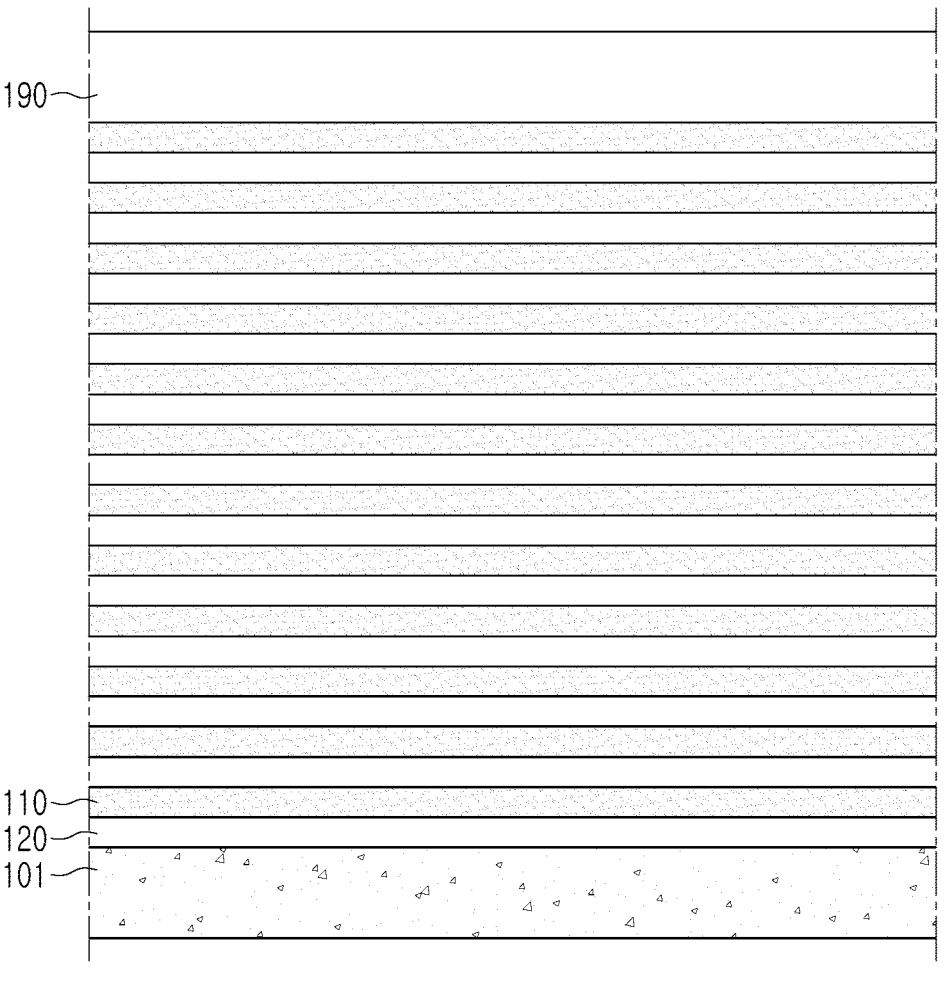
FIGS. 11A to 11L are cross-sectional views schematically illustrating a method of manufacturing a semiconductor device according to an example embodiment.
Figure 11A:
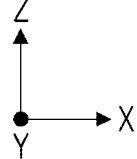

Referring to FIG. 11A, a stack structure may be formed by alternately stacking horizontal sacrificial layers 110 and interlayer insulating layers 120 on a substrate 101.

The horizontal sacrificial layers 110 may be layers to be replaced with gate electrodes 130 by subsequent operations.

The horizontal sacrificial layers 110 may be formed of a material different from that of the interlayer insulating layers 120. For example, the interlayer insulating layers 120 may be formed of at least one of silicon oxide and silicon nitride, and the horizontal sacrificial layers 110 may be formed of a material different from that of interlayer insulating layers 120, selected from silicon, silicon oxide, silicon carbide, and silicon nitride. In some embodiments, thicknesses of the interlayer insulating layers 120 may not all be the same. For example, a lowermost interlayer insulating layer 120 may be formed to be relatively thin, and an uppermost interlayer insulating layer 120 may be formed to be relatively thick. Thicknesses of the interlayer insulating layers 120 and the horizontal sacrificial layers 110, and the number of films constituting them may vary from those illustrated. A cell region insulating layer 190 may be formed on/in an uppermost portion of the stack structure shown in FIG. 11A.

Figure 11B:
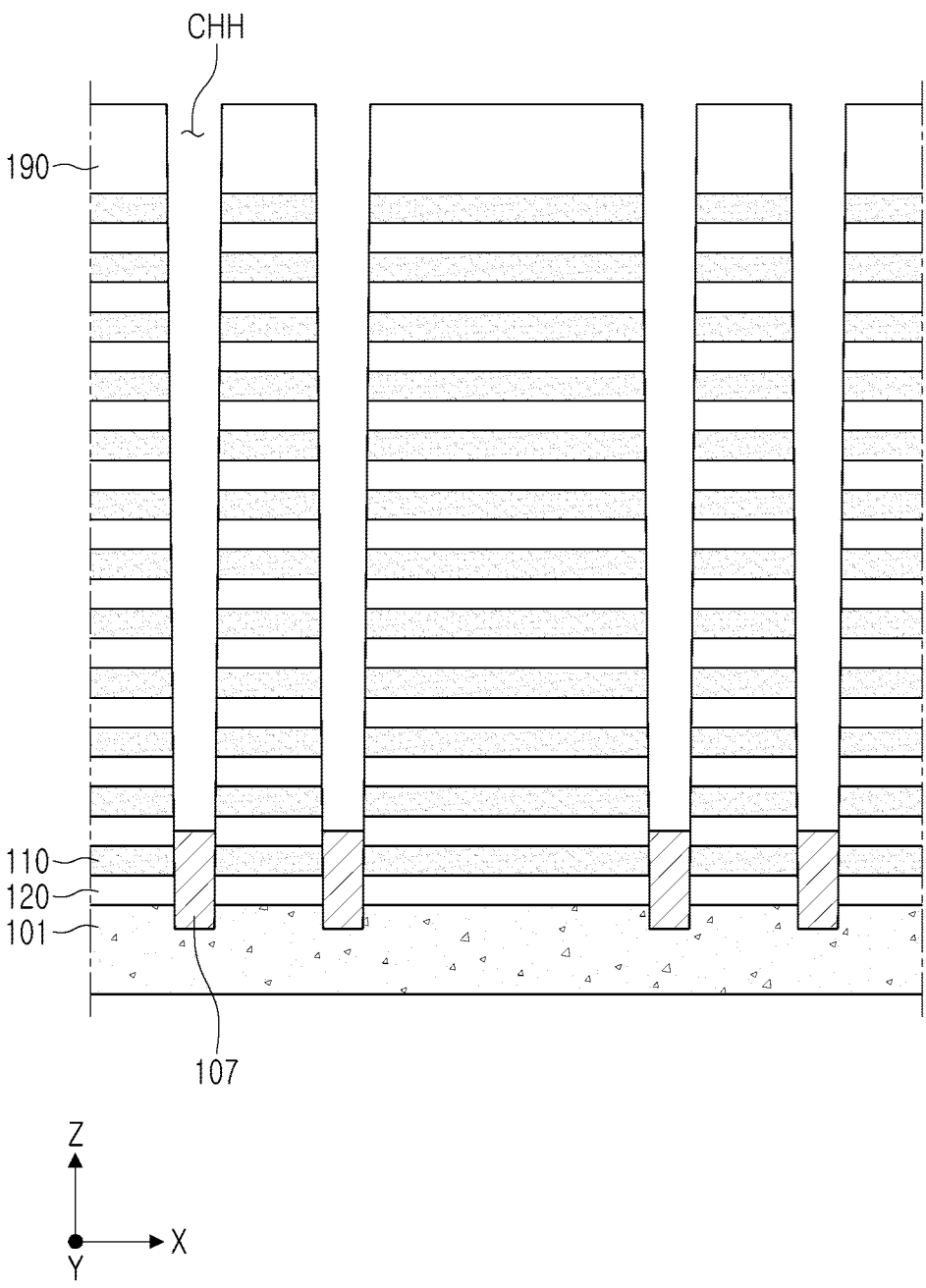

Referring to FIG. 11B, channel holes CHH may be formed to pass through the stack structure of the horizontal sacrificial layers 110 and the interlayer insulating layers 120, and epitaxial layers 107 may be formed in a lower portion of the channel holes CHH.

The channel holes CHH may be formed by anisotropically etching the horizontal sacrificial layers 110 and the interlayer insulating layers 120, and may be formed in a hole shape. Due to a height of the stack structure, side walls of the channel holes CHH may not be perpendicular to an upper surface of the substrate 101. The channel holes CHH may be formed to recess a portion of the substrate 101.

The epitaxial layers 107 may be formed using a selective epitaxial growth (SEG) process. The epitaxial layers 107 may be formed as a single layer or a plurality of layers. The epitaxial layers 107 may include polycrystalline silicon, single crystalline silicon, polycrystalline germanium, or single crystalline germanium, with or without doping impurities. In some embodiments, the epitaxial layers 107 may be omitted.

Figure 11C:
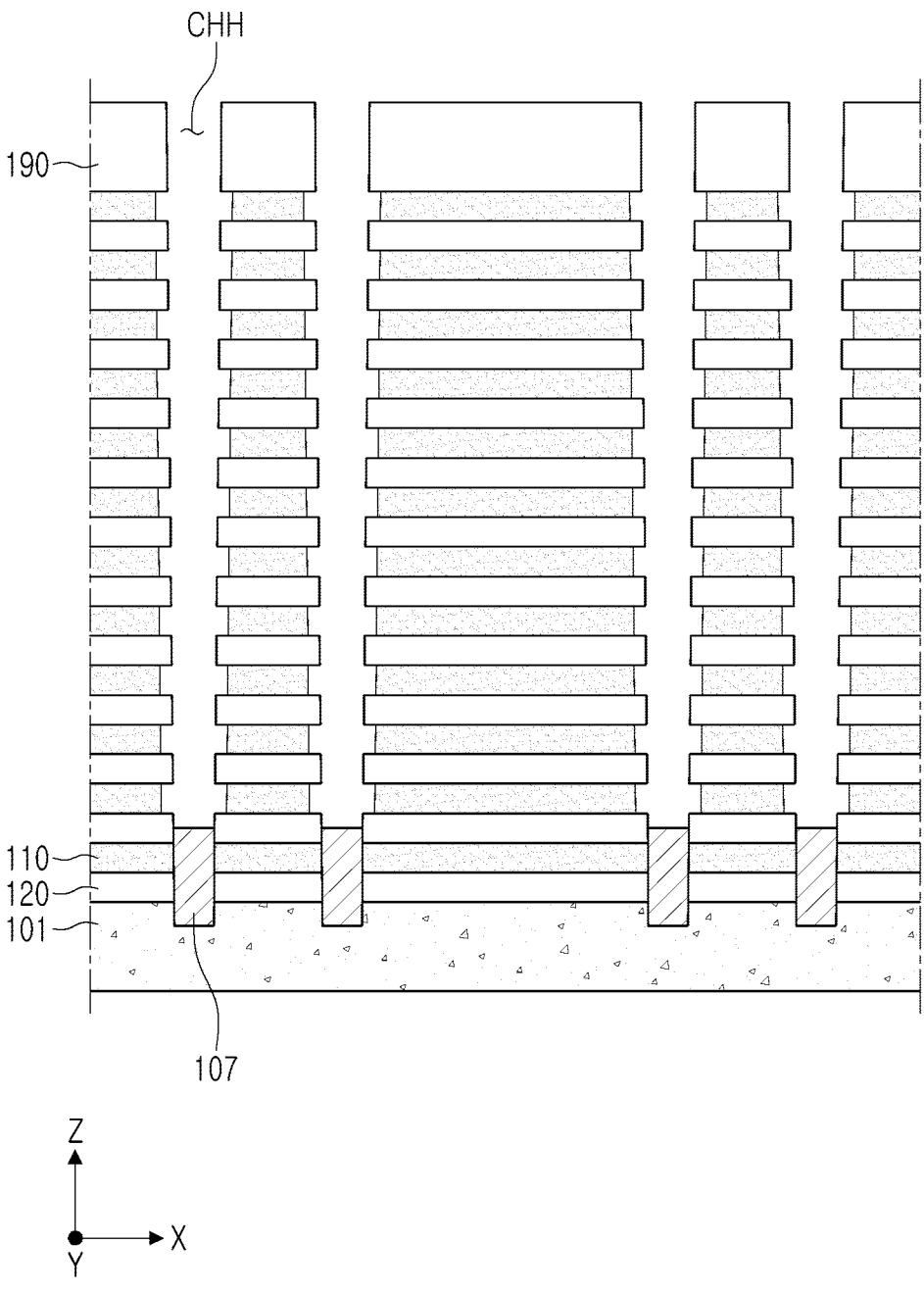

Referring to FIG. 11C, the horizontal sacrificial layers 110 exposed through the channel holes CHH may be partially removed.

The horizontal sacrificial layers 110 may be partially removed from the channel holes CHH. Therefore, recess regions from which the portions of the horizontal sacrificial layers 110 are removed may be formed outside of the channel holes CHH. The removal operation may be performed by, for example, a wet etching process. Therefore, side surfaces of the horizontal sacrificial layers 110 exposed toward the channel holes CHH may be located farther than side surfaces of the interlayer insulating layers 120 from central portions of the channel holes CHH.

Figure 11D:
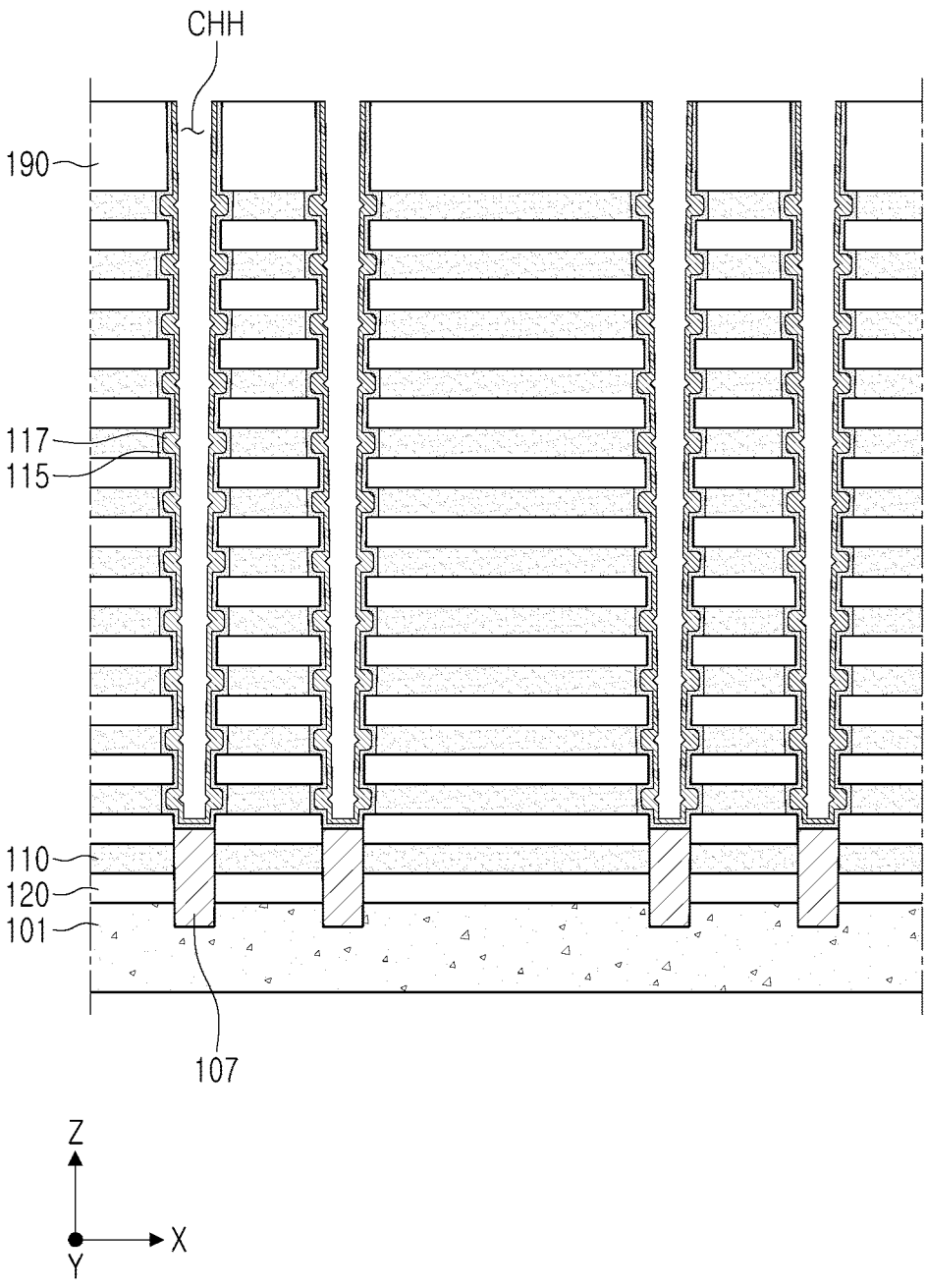

Referring to FIG. 11D, first and second vertical sacrificial layers 115 and 117 may be formed on the external wall of the channel holes CHH.

The first and second vertical sacrificial layers 115 and 117 may be formed along side surfaces of the horizontal sacrificial layers 110 and side surfaces of the interlayer insulating layers 120, exposed through the channel holes CHH. The first vertical sacrificial layer 115 may be formed to be relatively thin, and the recessed regions of the horizontal sacrificial layers 110 may be completely filled by the first and second vertical sacrificial layers 115 and 117. The first and second vertical sacrificial layers 115 and 117 may include different materials. The first vertical sacrificial layer 115 may include a material different from the horizontal sacrificial layers 110. For example, the first vertical sacrificial layer 115 may include silicon oxide, and the second vertical sacrificial layer 117 may include polycrystalline silicon.

Figure 11E:
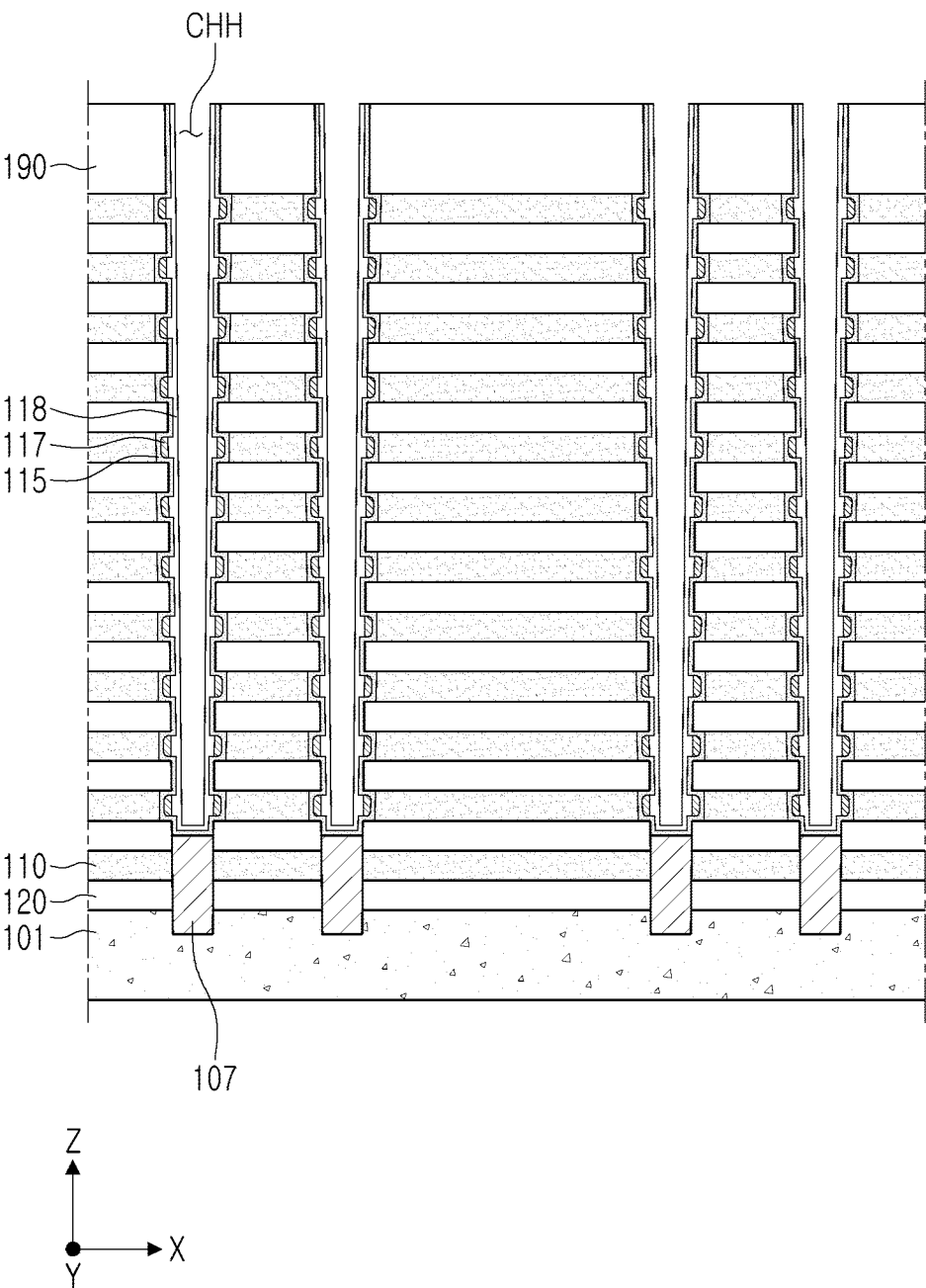

Referring to FIG. 11E, a portion of the second vertical sacrificial layers 117 may be oxidized to form oxidized sacrificial layers 118.

The oxidized sacrificial layers 118 may be formed by oxidizing the second vertical sacrificial layers 117 to a predetermined thickness in regions in which the second vertical sacrificial layers 117 are exposed through the channel holes CHH. The oxidation operation may be performed under a condition that all of the second vertical sacrificial layers 117 formed on the first vertical sacrificial layers 115 are oxidized at least on the side surfaces of the interlayer insulating layers 120. Therefore, the second vertical sacrificial layers 117 formed in regions in which the horizontal sacrificial layers 110 are recessed may remain without being oxidized. The remaining second vertical sacrificial layers 117 may be separated from each other on the side surfaces of the horizontal sacrificial layers 110 in the vertical direction.

Figure 11F:
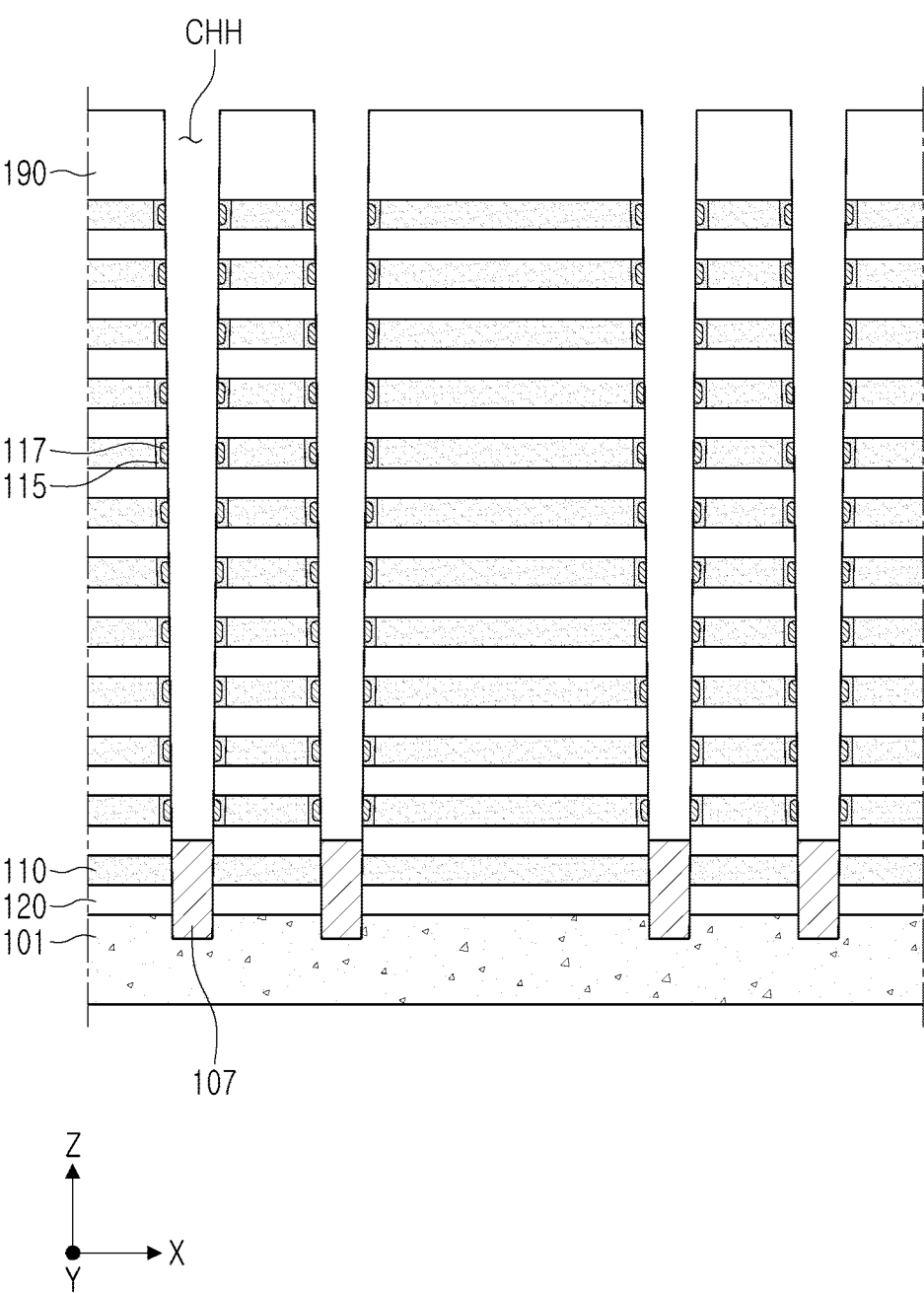

Referring to FIG. 11F, the oxidized sacrificial layers 118 may be removed.

The oxidized sacrificial layers 118 exposed through the channel holes CHH may be selectively removed by, for example, a wet etching process. For example, when the oxidized sacrificial layers 118 are formed of the same material as the first vertical sacrificial layers 115, the first vertical sacrificial layers 115 on the side surface of the interlayer insulating layers 120 in this operation may also be removed together. Therefore, the first and second vertical sacrificial layers 115 and 117 may remain confined to the recessed regions of the horizontal sacrificial layers 110, and may have a form separated from each other along the horizontal sacrificial layers 110 in the z direction.

Figure 11G:
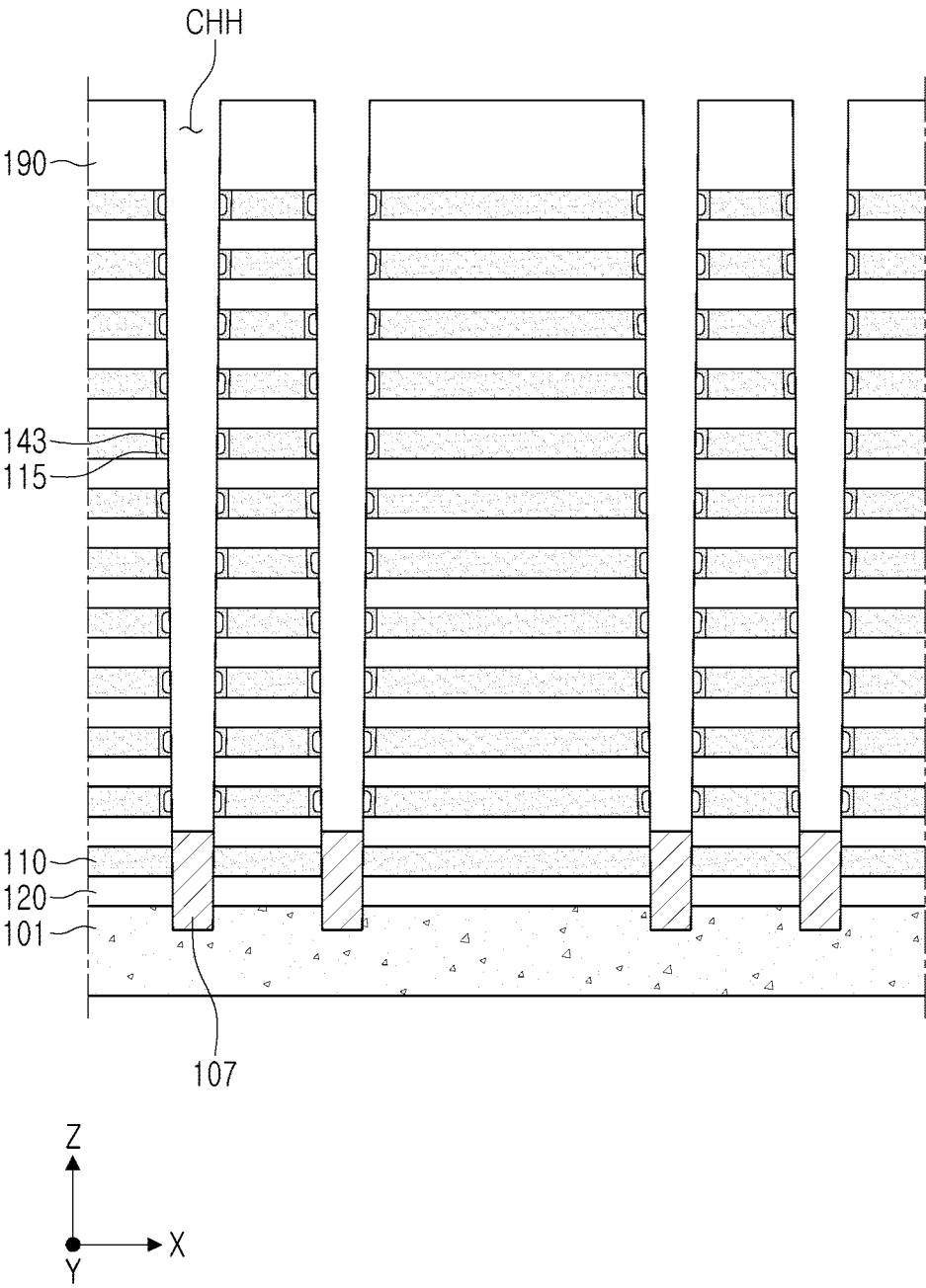

Referring to FIG. 11G, the second vertical sacrificial layers 117 may be nitrided to form charge storage layers 143.

The second vertical sacrificial layers 117 exposed through the channel holes CHH may be selectively nitrided. The nitriding operation may be performed by injecting nitride gas through the channel holes CHH. For example, when the second vertical sacrificial layers 117 are formed of polycrystalline silicon, charge storage layers 143 of silicon nitride may be formed by the nitriding operation.

As such, the second vertical sacrificial layers 117 may be nitrided to form the charge storage layers 143, such that the charge storage layers 143 may be formed on the side surfaces of the horizontal sacrificial layers 110 without a variation in operation, respectively, and may be formed to a substantially constant thickness.

Figure 11H:
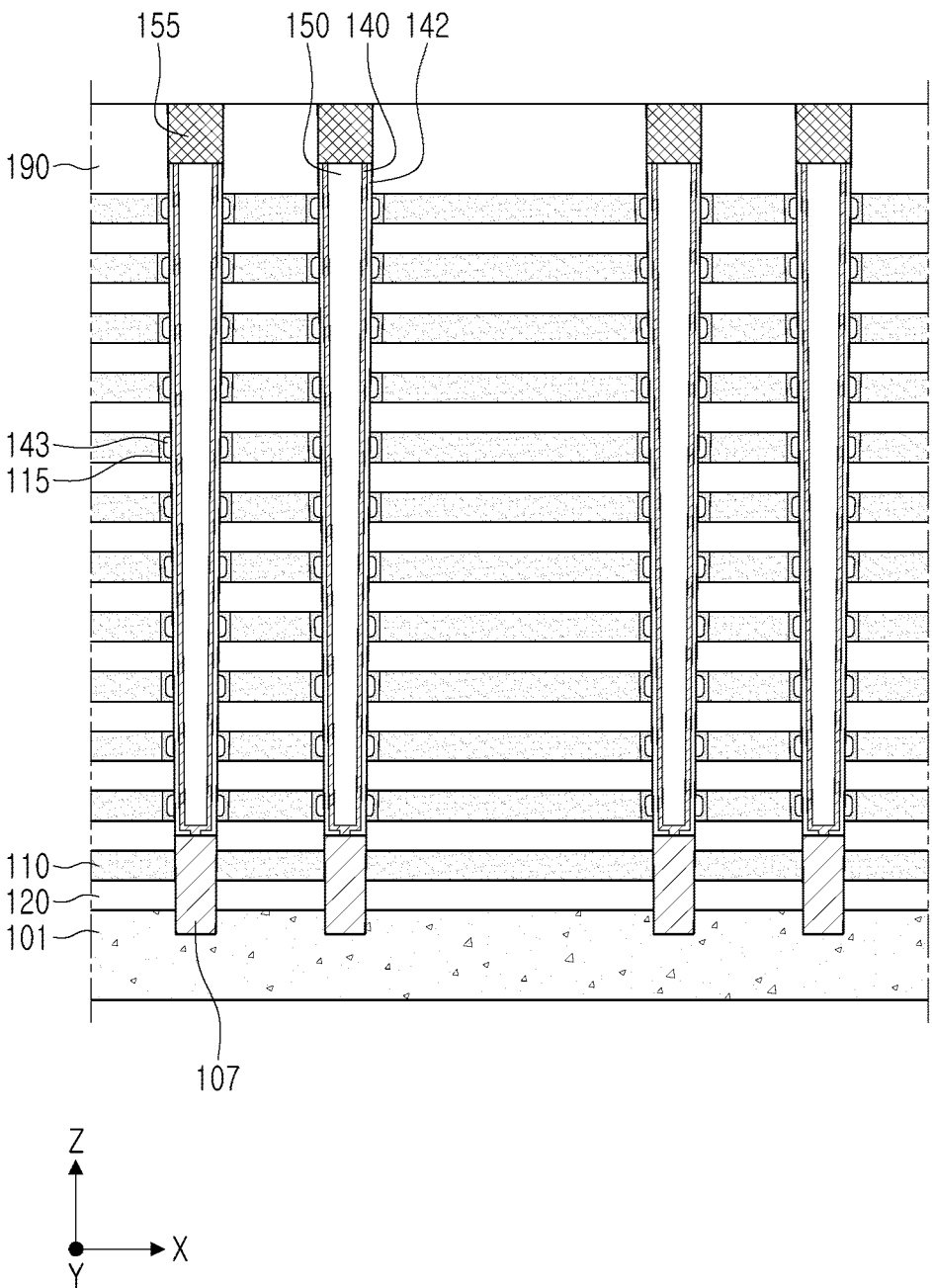

Referring to FIG. 11H, tunneling insulating layers 142, channel layers 140, and channel insulating layers 150 may be sequentially formed on the charge storage layers 143, and channel pads 155 may be formed in an upper portion of the channel holes CHH.

The tunneling insulating layers 142 and the channel layers 140 may be formed to have a uniform thickness using an atomic layer deposition (ALD) process or chemical vapor deposition (CVD) process. The tunneling insulating layers 142 and the channel layers 140 may be formed to extend perpendicularly to the substrate 101. The tunneling insulating layers 142 may be formed to cover exposed surfaces of the charge storage layers 143, and the channel layers 140 may be formed to be connected to the epitaxial layers 107 in the lower portion of the channel holes CHH. The channel insulating layer 150 may be formed to fill internal spaces of the channel layers 140, and may be an insulating material. In some embodiments, the channel layer 140 may be filled with a conductive material, not the channel insulating layer 150. The channel pad 155 may be formed of a conductive material, for example, polycrystalline silicon.

Figure 11I:
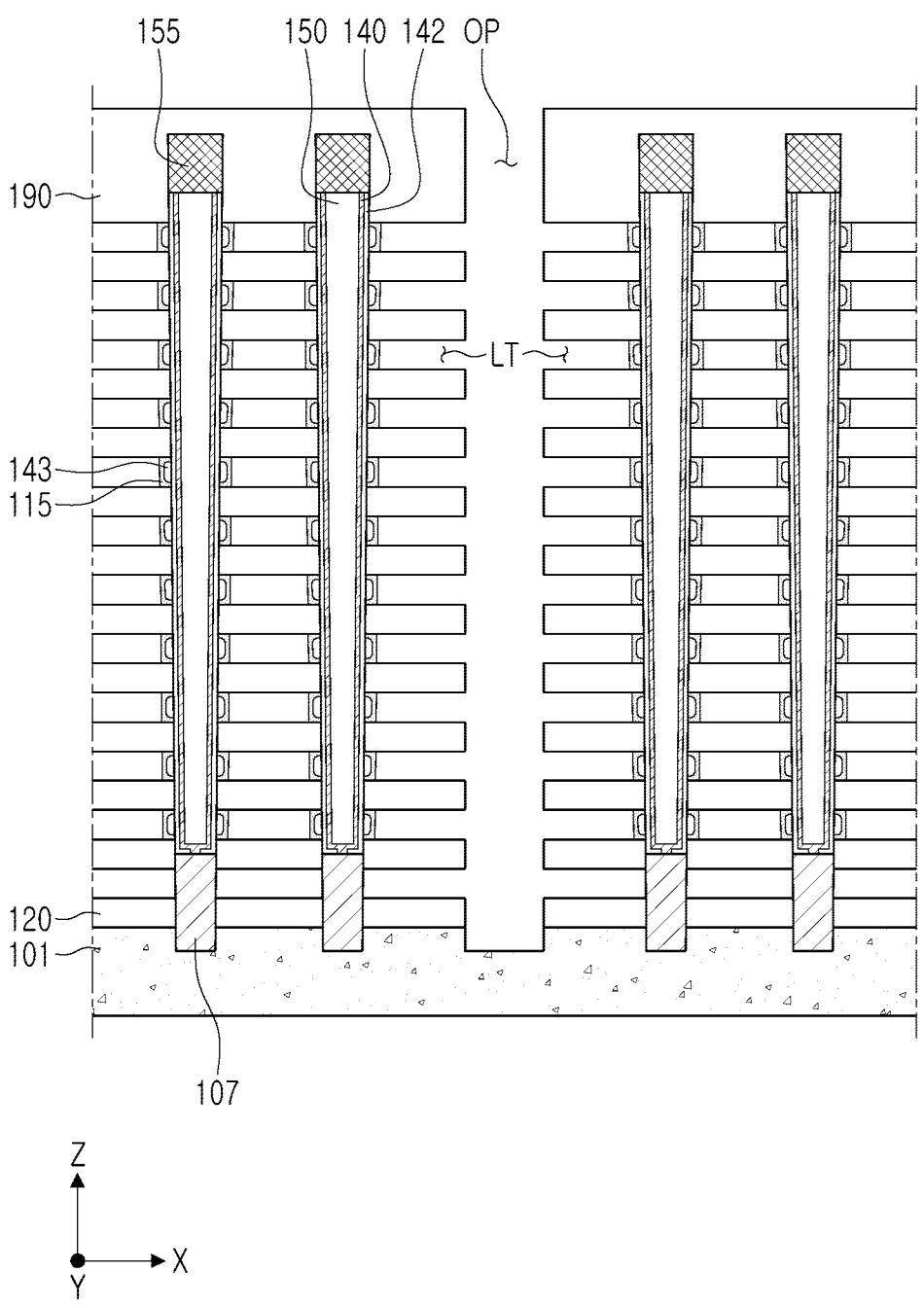

Referring to FIG. 11I, an opening OP passing through the stack structure of the horizontal sacrificial layers 110 and the interlayer insulating layers 120 may be formed, and the horizontal sacrificial layers 110 may be removed through the opening OP, to form lateral openings LT.

First, before forming the opening OP, the cell region insulating layer 190 may be further formed on the channel pads 155. The opening OP may be formed at a position of the separation region SR of FIGS. 1 and 2. The opening OP may be formed by forming a mask layer using a photolithography process, and anisotropically etching the stack structure. The opening OP may be formed in a trench shape extending in the y direction, and the substrate 101 may be exposed in/by a lower portion of the opening OP.

The horizontal sacrificial layers 110 may be selectively removed with respect to the interlayer insulating layers 120 and the first vertical sacrificial layers 115, for example, using a wet etching process. Therefore, a plurality of lateral openings LT may be formed between the interlayer insulating layers 120, and a portion of the first vertical sacrificial layers 115 may be exposed through the lateral openings LT.

Figure 11J:
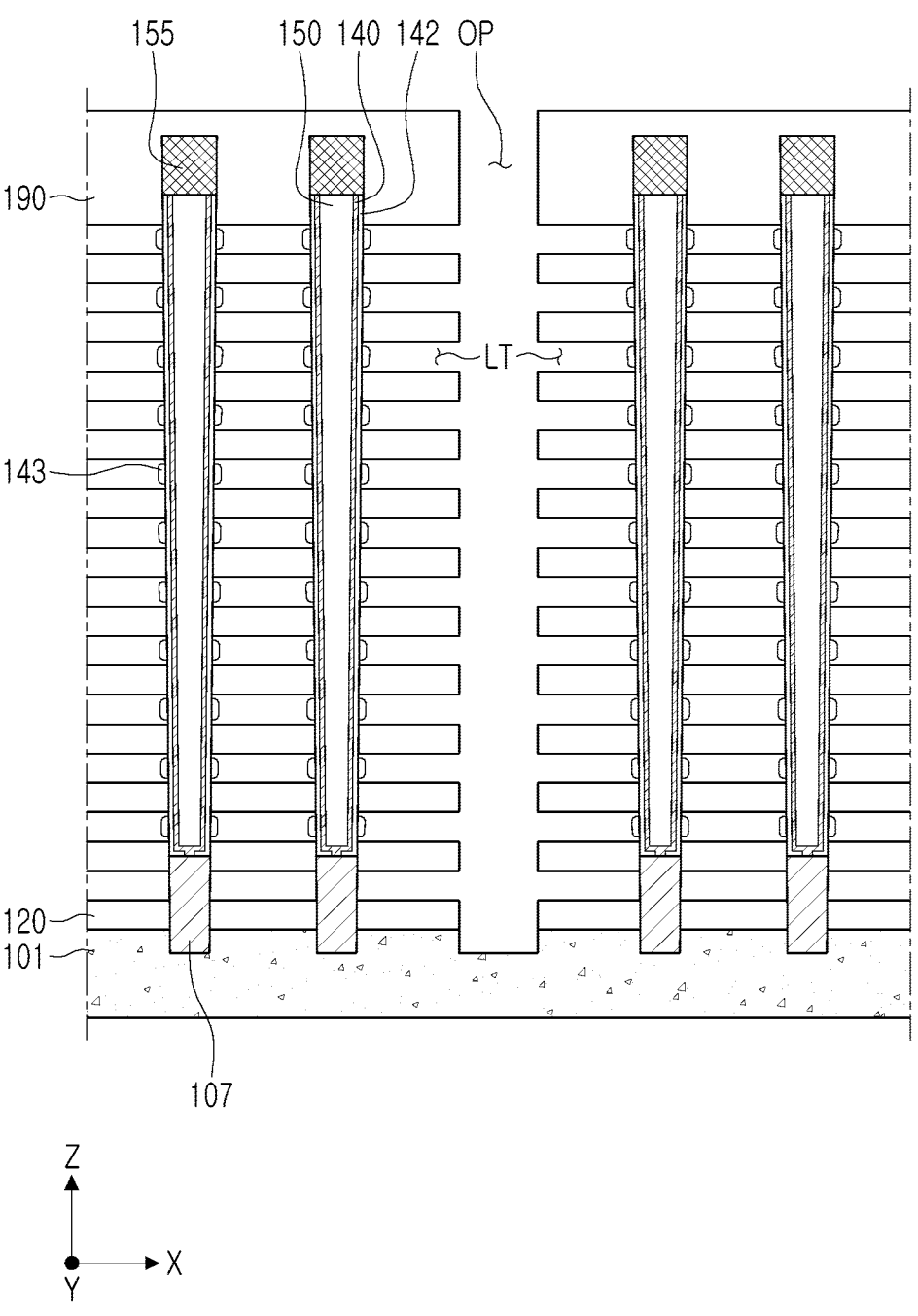

Referring to FIG. 11J, the first vertical sacrificial layers 115 exposed through the lateral openings LT may be removed.

The first vertical sacrificial layers 115 may be selectively removed by, for example, a wet etching process to expose external side surfaces of the charge storage layers 143. For example, when the first vertical sacrificial layers 115 are formed of the same material as the interlayer insulating layers 120, the interlayer insulating layers 120 exposed through the lateral openings LT in this operation may also be partially removed. In this case, heights of the lateral openings LT may increase.

Figure 11K:
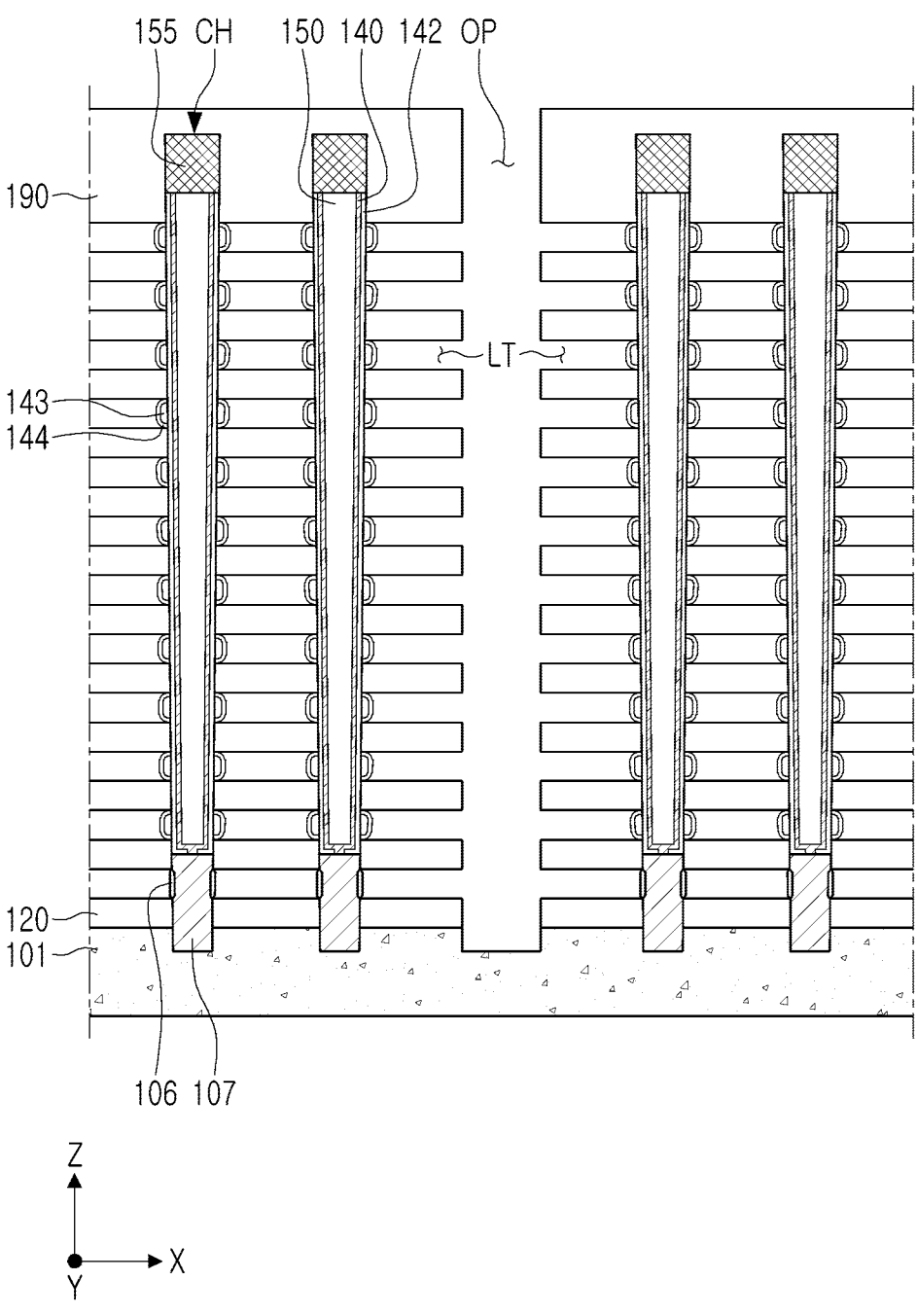

Referring to FIG. 11K, first blocking insulating layers 144 covering upper, lower, and external side surfaces of the charge storage layers 143 may be formed in the lateral openings LT.

The first blocking insulating layers 144 may be formed by an oxidation operation that supplies oxidizing gas through the lateral openings LT. When the first blocking insulating layers 144 are formed, a portion of the charge storage layers 143 may be consumed. The first blocking insulating layers 144 may be formed to surround all external surfaces of the charge storage layers 143 not contacting the tunneling insulating layer 142, and may be formed to be in contact with the interlayer insulating layers 120. In this operation, side insulating layers 106 may also be formed on side surfaces of the epitaxial layers 107. Therefore, a channel structure CH including the epitaxial layer 107, the channel layer 140, the tunneling insulating layer 142, the channel insulating layer 150, the channel pad 155, the charge storage layers 143, the first blocking insulating layers 144, and side insulating layers 106 may be formed.

The embodiments of FIGS. 6A to 7 may be prepared by forming the first blocking insulating layers 144c using a deposition process, not the oxidation process in this operation. In this case, since the deposition process is performed not only around the charge storage layers 143, but also on the upper and lower surfaces of the interlayer insulating layers 120, the first blocking insulating layers 144c of FIGS. 6A to 7 may be formed. In the case of the embodiment of FIG. 7, after forming the third blocking insulating layer 148 on the first vertical sacrificial layer 115 in advance, the first blocking insulating layers 144c may be formed by the deposition process in this operation.

Figure 11L:
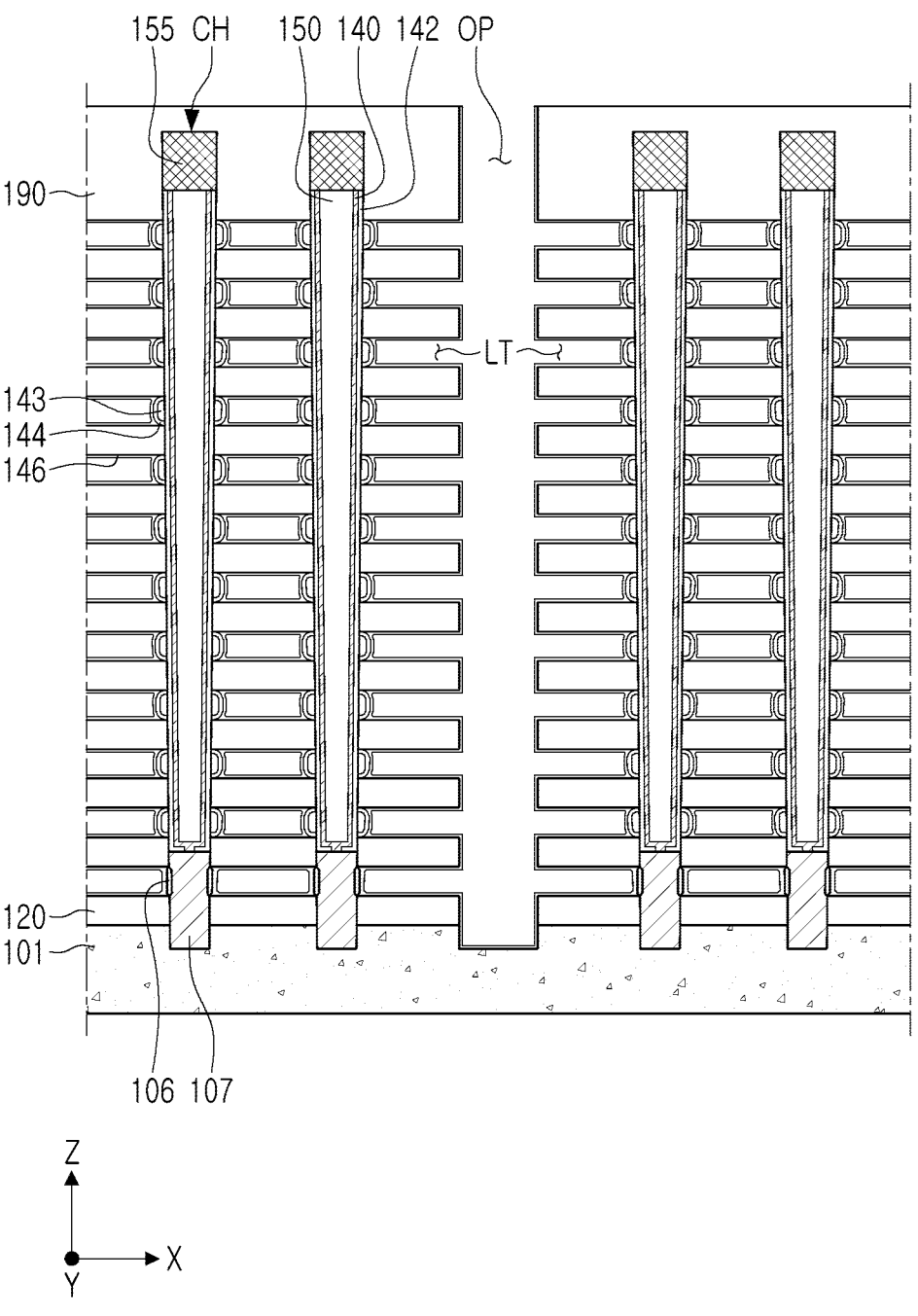

Referring to FIG. 11L, second blocking insulating layers 146 may be formed in the lateral openings LT.

The second blocking insulating layers 146 may be formed on the upper and lower surfaces of the interlayer insulating layers 120 and on the external side surfaces of the first blocking insulating layers 144, exposed through the lateral openings LT.

Next, referring to FIG. 2, the gate electrodes 130 may be formed by filling a conductive material in the lateral openings LT, and the separating insulating layers 185 and the source conductive layer 180 may be formed in the opening OP.

The conductive material may include a metal, polycrystalline silicon, or metal silicide material. After the gate electrodes 130 are formed, the conductive material deposited in the opening OP may be removed by an additional process. The separation insulating layers 185 may be formed in a form of a spacer in the opening OP. For example, after the insulating material is deposited, the separation insulating layers 185 may be formed by removing the insulating material formed on the substrate 101 in the lower portion of the opening OP. Next, the semiconductor device 100 of FIG. 2 may be prepared by depositing a conductive material on the separation insulating layers 185 to form the source conductive layer 180.

Figure 12A:
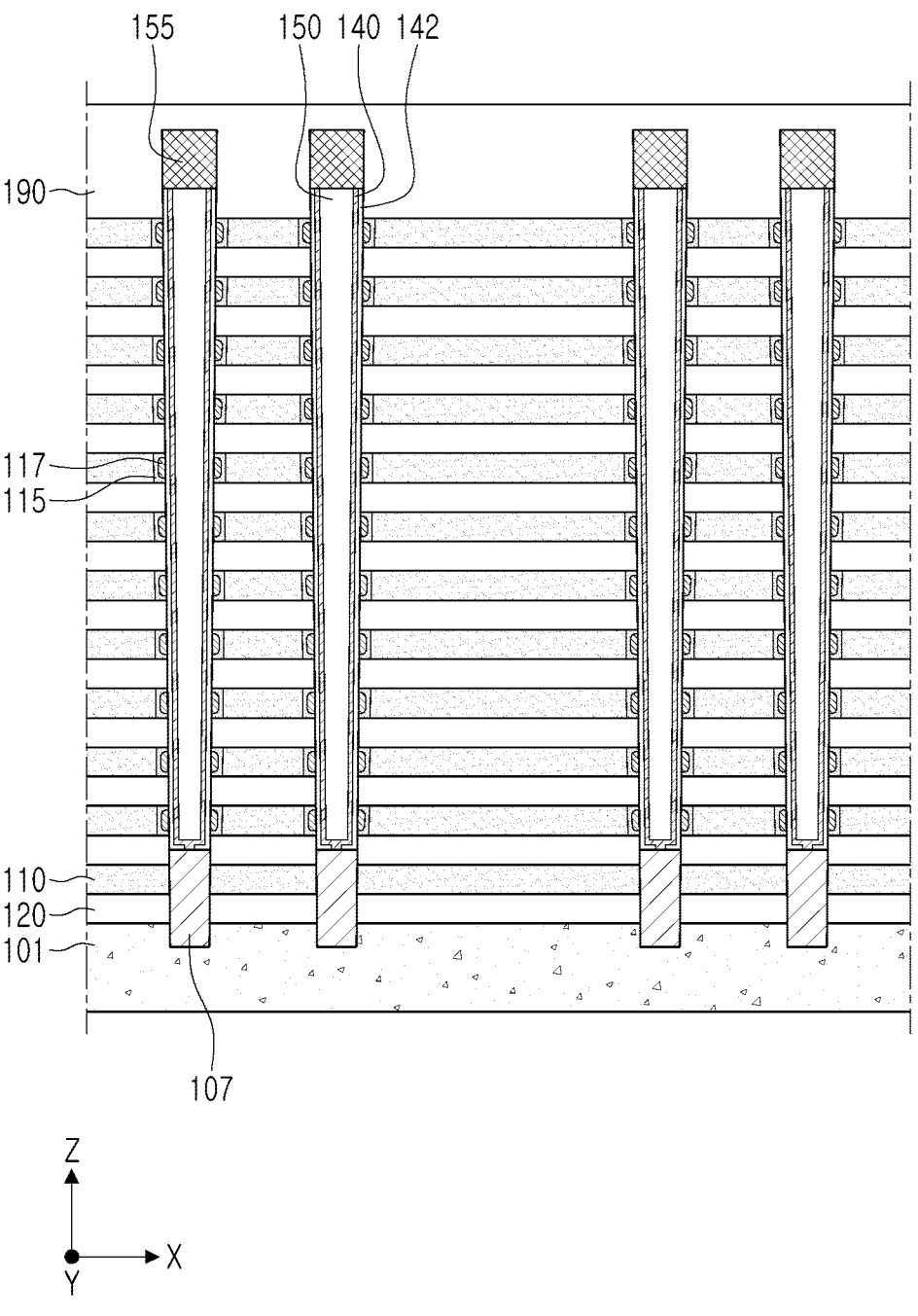
FIGS. 12A to 12C are cross-sectional views schematically illustrating a method of manufacturing a semiconductor device according to an example embodiment.
Figure 12B:
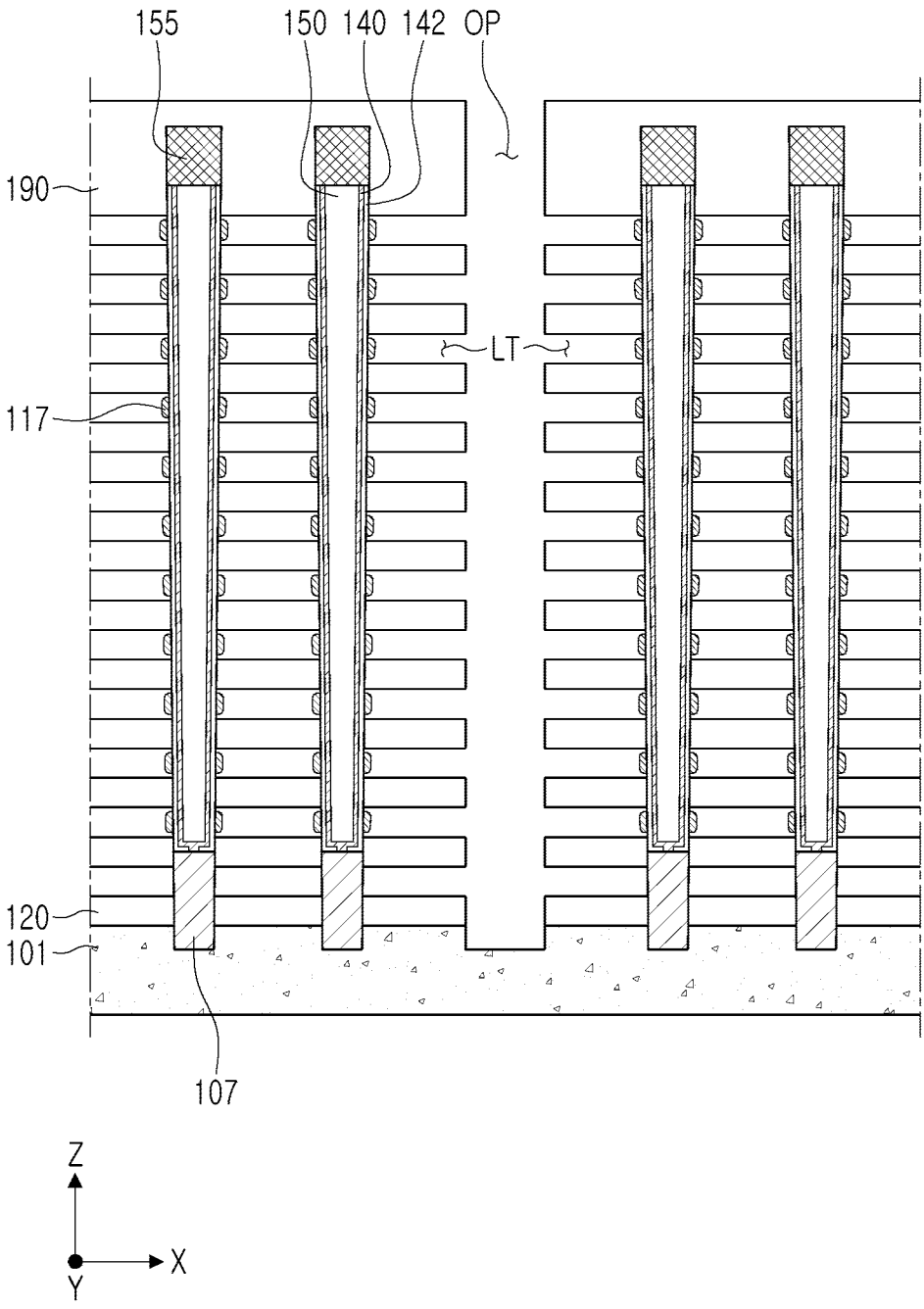
Figure 12C:
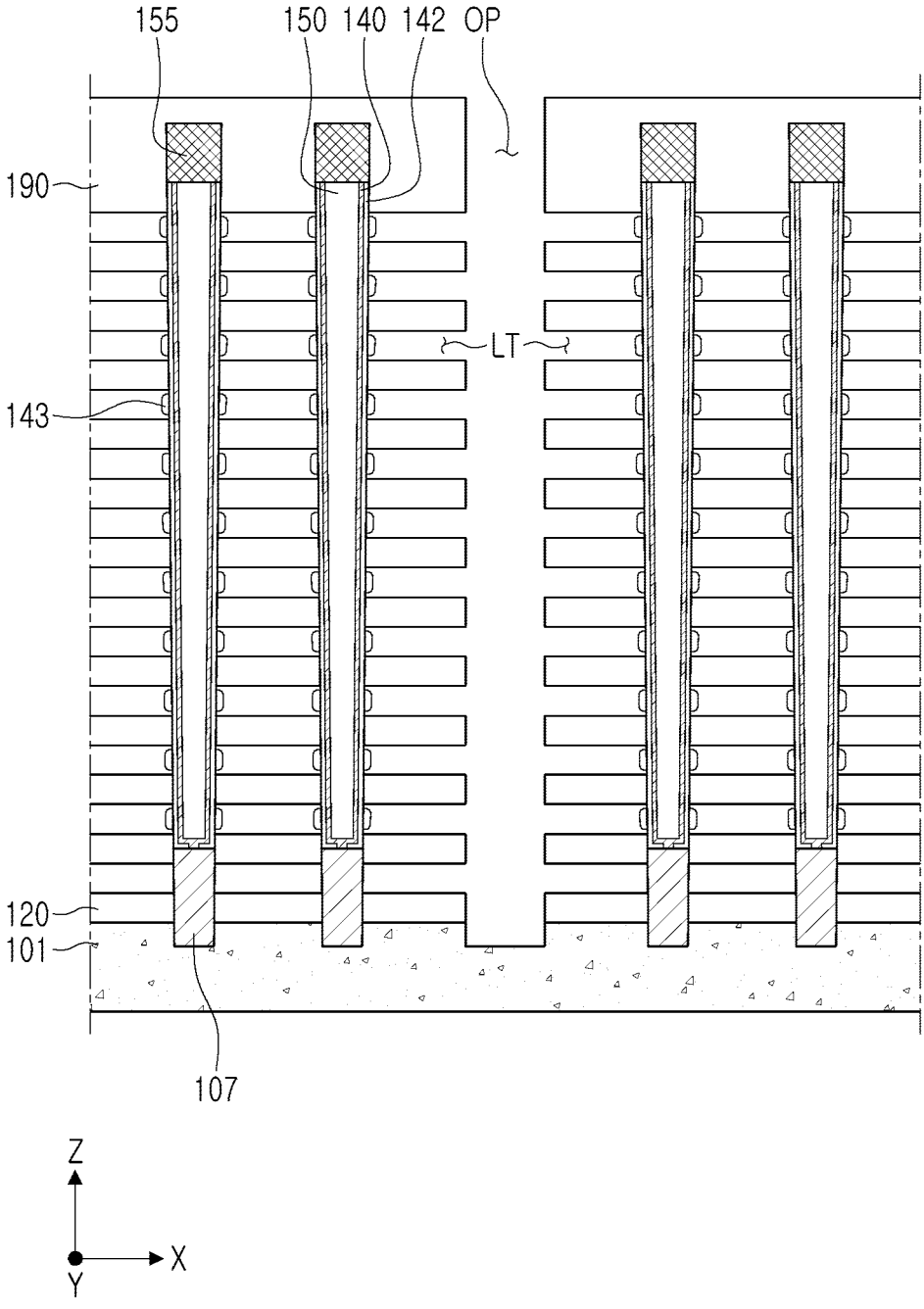

FIGS. 12A to 12C are cross-sectional views schematically illustrating a method of manufacturing a semiconductor device according to an example embodiment. FIGS. 12A to 12C illustrate cross-sectional views corresponding to FIG. 2.

Referring to FIG. 12A, first, the operations described above with reference to FIGS. 11A to 11F may be performed in the same manner, such that the first and second vertical sacrificial layers 115 and 117 and the oxidized sacrificial layers 118 may be formed through the channel holes CHH, and the oxidized sacrificial layers 118 may be then removed.

Next, as illustrated in FIG. 12A, tunneling insulating layers 142, channel layers 140, and channel insulating layers 150 may be sequentially formed on the second vertical sacrificial layers 117. In addition, channel pads 155 may be formed in an upper portion of the channel holes CHH. For operations of forming the tunneling insulating layers 142, the channel layers 140, the channel insulating layers 150, and the channel pads 155, the description described above with reference to FIG. 11H may be equally applied.

Referring to FIG. 12B, an opening OP passing through the stack structure of the horizontal sacrificial layers 110 and the interlayer insulating layers 120 may be formed, and the horizontal sacrificial layers 110 may be removed through the opening OP to form lateral openings LT, and the first vertical sacrificial layers 115 may be removed.

First, the opening OP may be formed at positions of the separation regions SR of FIG. 1. The horizontal sacrificial layers 110 may be selectively removed with respect to the interlayer insulating layers 120 and the first vertical sacrificial layers 115, for example, using a wet etching process. Therefore, the plurality of lateral openings LT may be formed between the interlayer insulating layers 120, and a portion of the first vertical sacrificial layers 115 may be exposed through the lateral openings LT.

Next, the first vertical sacrificial layers 115 may be selectively removed by, for example, a wet etching process, to expose the second vertical sacrificial layers 117. For example, when the first vertical sacrificial layers 115 are formed of the same material as the interlayer insulating layers 120, the interlayer insulating layers 120 exposed through the lateral openings LT in this operation may also be partially removed. In this case, heights of the lateral openings LT may increase.

Referring to FIG. 12C, the second vertical sacrificial layers 117 exposed through the lateral openings LT may be nitrided to form charge storage layers 143.

The exposed second vertical sacrificial layers 117 may be selectively nitrided by injecting nitride gas through the lateral openings LT. For example, when the second vertical sacrificial layers 117 are formed of polycrystalline silicon, charge storage layers 143 of silicon nitride may be formed by the nitriding operation. As described above, according to the manufacturing method of this example embodiment, an order in which operations of forming the charge storage layers 143 by the nitriding operation are performed may be different from that in the manufacturing method described above with reference to FIGS. 11A to 11L.

Next, operations of forming the first blocking insulating layers 144 and the second blocking insulating layers 146 described above with reference to FIGS. 11K and 11L may be performed in the same manner to manufacture the semiconductor device 100 of FIG. 2.

Figure 13A:
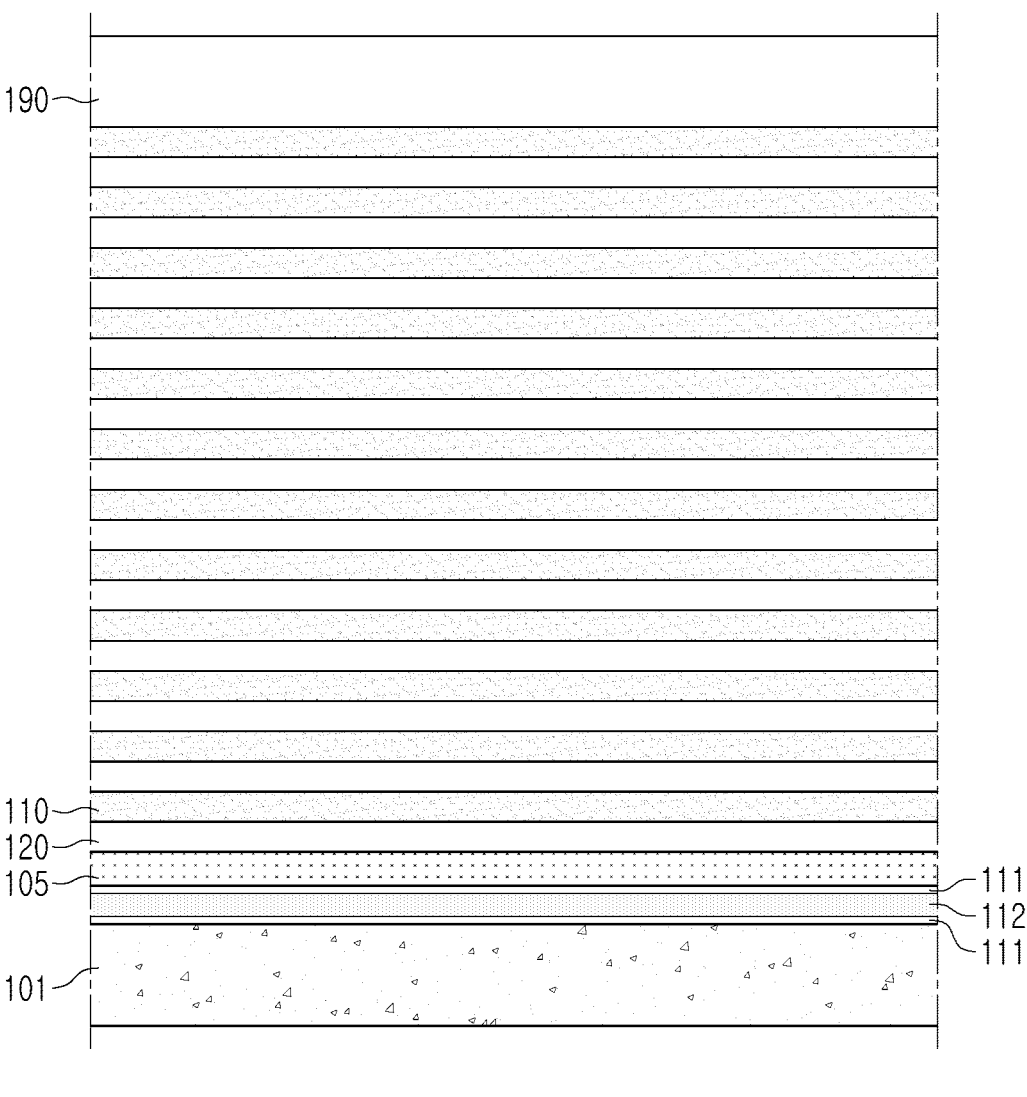
FIGS. 13A to 13C are cross-sectional views schematically illustrating a method of manufacturing a semiconductor device according to an example embodiment.
Figure 13A:
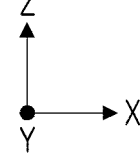
Figure 13B:
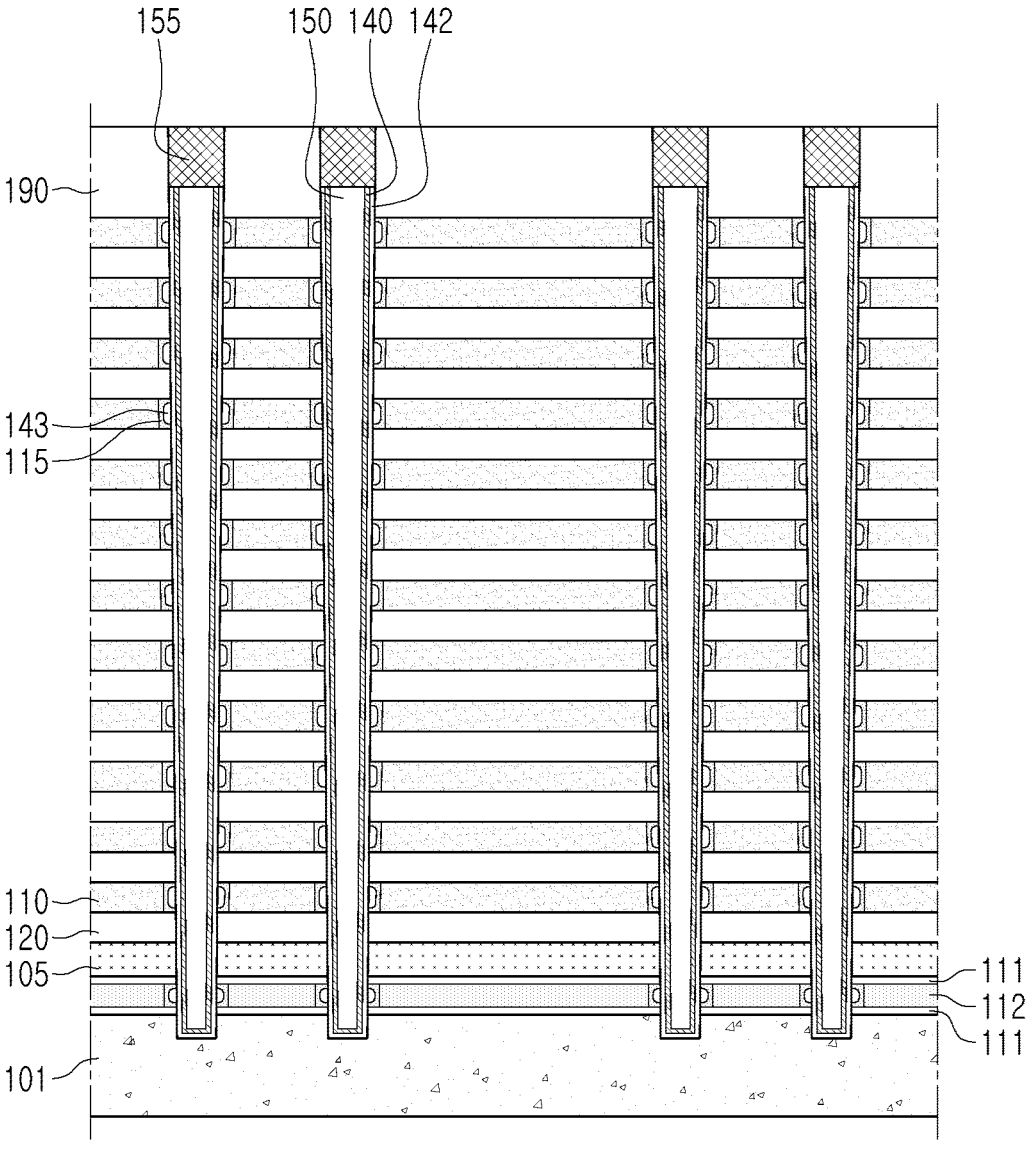
Figure 13B:
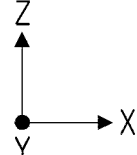
Figure 13C:
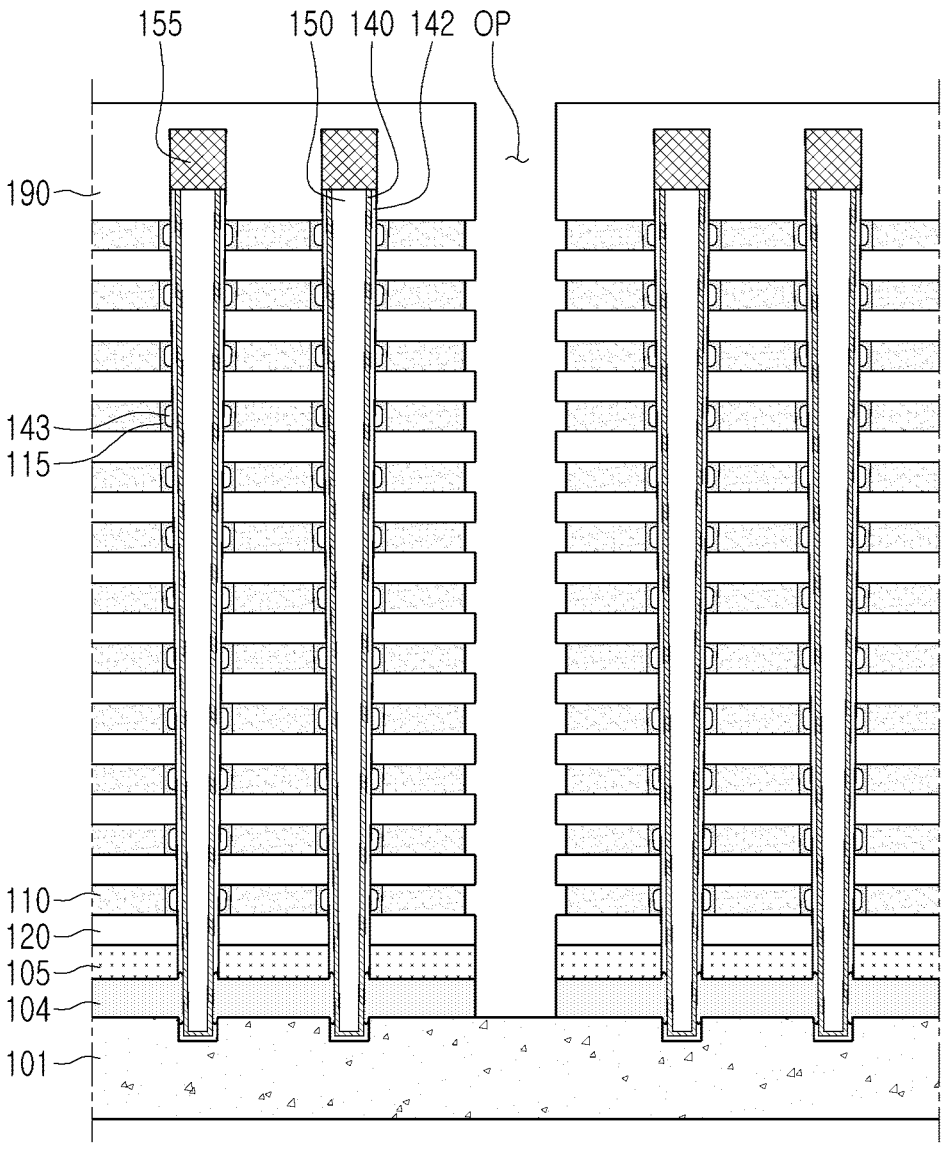
Figure 13C:
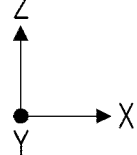

FIGS. 13A to 13C are cross-sectional views schematically illustrating a method of manufacturing a semiconductor device according to an example embodiment. FIGS. 13A to 13C illustrate cross-sectional views corresponding to FIG. 8.

Referring to FIG. 13A, first and second source sacrificial layers 111 and 112 and a second conductive layer 105 may be formed on a substrate 101, and horizontal sacrificial layers 110 and interlayer insulating layers 120 may be alternately stacked to form a stack structure.

First, the first and second source sacrificial layers 111 and 112 may include different materials, and may be stacked on the substrate 101, such that the first source sacrificial layers 111 are disposed on and below the second source sacrificial layer 112. The first and second source sacrificial layers 111 and 112 may be layers to be replaced with the first conductive layer 104 of FIG. 8 by subsequent operations. For example, the first source sacrificial layer 111 may be formed of the same material as the interlayer insulating layers 120, and the second source sacrificial layer 112 may be formed of the same material as the horizontal sacrificial layers 110. The second conductive layer 105 may be deposited on the first and second source sacrificial layers 111 and 112.

Next, similar to those described above with reference to FIG. 11A, the horizontal sacrificial layers 110, the interlayer insulating layers 120, and the cell region insulating layer(s) 190 may be formed on the second conductive layer 105.

Referring to FIG. 13B, first, the operations described above with reference to FIGS. 11B to 11G may be performed in the same manner to form charge storage layers 143. In particular, in this example embodiment, the charge storage layers 143, together with first vertical sacrificial layers 115, may be formed on side surfaces of the second source sacrificial layer 112.

Next, as illustrated in FIG. 13B, channel layers 140, tunneling insulating layers 142, channel insulating layers 150, and channel pads 155 may be formed. For operations of forming the tunneling insulating layers 142, the channel layers 140, the channel insulating layers 150, and the channel pads 155, the description described above with reference to FIG. 11H may be equally applied. In this example embodiment, in the lower portion of the channel holes CHH, the channel layers 140 and the tunneling insulating layers 142 may be disposed to extend into the substrate 101.

Referring to FIG. 13C, an opening OP passing through the stack structure of the horizontal sacrificial layers 110, the first and second source sacrificial layers 111 and 112, and the interlayer insulating layers 120 may be formed. After removing the first and second source sacrificial layers 111 and 112 through the opening OP, a first conductive layer 104 may be formed.

In example embodiments, before removing the first and second source sacrificial layers 111 and 112, a spacer layer may be formed on a side wall of the opening OP to protect the horizontal sacrificial layers 110. After removing the second source sacrificial layer 112 through the opening OP in advance, the first source sacrificial layers 111 may be removed. The first and second source sacrificial layers 111 and 112 may be removed by, for example, a wet etching process. In the removal operation of the first source sacrificial layers 111, the tunneling insulating layer 142 exposed in a region from which the second source sacrificial layer 112 is removed may also be partially removed. After the first conductive layer 104 may be formed by depositing a conductive material in a region from which the first and second source sacrificial layers 111 and 112 are removed, the spacer layer may be removed. The first conductive layer 104 may be in direct contact with the channel layer 140 in a region from which the tunneling insulating layer 142 is removed.

Next, the horizontal sacrificial layers 110 may be removed through the openings OP as described above with reference to FIG. 11I, and the operations described above with reference to FIGS. 11J to 11L may be performed in the same manner, to prepare the semiconductor device 100g of FIG. 8. In the manufacturing method of the semiconductor device 100g, an order in which operations of forming the charge storage layers 143 are performed may be changed as described above with reference to FIGS. 12A to 12C.

By disposing charge storage layers discontinuously/separately (e.g., vertically separated from each other by interlayer insulating layers) between the memory cells and arranging blocking insulating layers to surround the charge storage layers, a semiconductor device having improved reliability may be provided.

While example embodiments have been illustrated and described above, it will be apparent to those skilled in the art that modifications and variations can be made without departing from the scope of the present inventive concept as defined by the appended claims.

What is claimed is:

1. A semiconductor device comprising:
  gate electrodes spaced apart from each other on a substrate and stacked perpendicularly to an upper surface of the substrate;
  interlayer insulating layers alternately stacked with the gate electrodes on the substrate; and
  a channel structure passing through the gate electrodes and extending perpendicularly to the upper surface of the substrate,
  wherein the channel structure comprises:
  a channel layer extending perpendicularly to the upper surface of the substrate,
  a tunneling insulating layer on the channel layer and extending perpendicularly to the upper surface of the substrate,
  charge storage layers on the tunneling insulating layer in respective regions between the gate electrodes and a side surface of the tunneling insulating layer,
  first blocking insulating layers on the charge storage layers, respectively, and second blocking insulating layers on the gate electrodes, respectively, wherein a first layer of the first blocking insulating layers is on an entirety of an upper surface and an entirety of a lower surface of a first layer of the charge storage layers, and is further on a first side surface of the first layer of the charge storage layers facing a first electrode of the gate electrodes, wherein a height of each of the charge storage layers is less than a distance between a pair of the interlayer insulating layers that are adjacent to each other, in a first direction perpendicular to the upper surface of the substrate, wherein the first blocking insulating layers are in contact with the tunneling insulating layer and do not extend vertically on side surfaces of the interlayer insulating layers, wherein a first layer of the second blocking insulating layers is on an upper surface, a lower surface, and a side surface of the first electrode of the gate electrodes, and has an upper surface and a lower surface that are substantially coplanar with an upper surface and a lower surface, respectively, of the first layer of the first blocking insulating layers, wherein the first layer of the first blocking insulating layers is in contact with the first layer of the second blocking insulating layers, wherein a second side surface of the first layer of the charge storage layers facing the tunneling insulating layer includes a first portion extending parallel to a side surface of the channel layer and a second portion extending nonparallel to the side surface of the channel layer, and wherein the second portion of the second side surface of the first layer of the charge storage layers is in direct contact with a portion of the tunneling insulating layer including silicon oxide.

2. The semiconductor device according to claim 1, wherein an inner side surface and an external side surface of the first layer of the first blocking insulating layers have convex rounded shapes toward the first electrode of the gate electrodes.

3. The semiconductor device according to claim 1, wherein the first side surface of the first layer of the charge storage layers facing the first electrode of the gate electrodes has a convex rounded shape toward the first electrode of the gate electrodes.

4. The semiconductor device according to claim 1, wherein the upper surface and the lower surface of the first layer of the second blocking insulating layers are in contact with the interlayer insulating layers.

5. The semiconductor device according to claim 1, wherein the first blocking insulating layers include silicon oxide, and the second blocking insulating layers include aluminum oxide.

6. The semiconductor device according to claim 1, wherein each of the charge storage layers has a recessed portion that contacts the tunneling insulating layer, and
wherein the recessed portion of at least one of the charge storage layers has a concavely rounded shape.

7. The semiconductor device according to claim 1, wherein the interlayer insulating layers, the tunneling insulating layer, and the first blocking insulating layers include a same material.

8. The semiconductor device according to claim 1, wherein the first layer of the first blocking insulating layers and the first layer of the second blocking insulating layers are between the interlayer insulating layers to overlap the interlayer insulating layers, in the first direction perpendicular to the upper surface of the substrate, and
wherein the channel structure further comprises a channel insulating layer spaced apart from the first layer of the charge storage layers, with the channel layer and the tunneling insulating layer therebetween.

9. The semiconductor device according to claim 1, wherein the charge storage layers comprise nitride.

10. The semiconductor device according to claim 1, wherein the first layer of the charge storage layers has a recessed portion defined by the second portion.

11. The semiconductor device according to claim 1, wherein a first portion of the tunneling insulating layer is between the channel layer and the first layer of the first blocking insulating layers,
wherein a second portion of the tunneling insulating layer is between the channel layer and the first layer of the charge storage layers, and
wherein a thickness of the second portion of the tunneling insulating layer in a second direction parallel to the upper surface of the substrate is greater than a thickness of the first portion of the tunneling insulating layer in the second direction.

12. A semiconductor device comprising:
gate electrodes spaced apart from each other on a substrate and stacked perpendicularly to an upper surface of the substrate;
interlayer insulating layers alternately stacked with the gate electrodes on the substrate;
a channel layer extending into the gate electrodes and extending perpendicularly to the upper surface of the substrate;
a tunneling insulating layer between side surfaces of the interlayer insulating layers and the channel layer and extending perpendicularly to the upper surface of the substrate;
charge storage layers between the gate electrodes, respectively, and the tunneling insulating layer, wherein a first layer of the charge storage layers is between a side surface of a first electrode of the gate electrodes and a side surface of the tunneling insulating layer, and between a pair of the interlayer insulating layers that are adjacent to each other in a direction perpendicular to the upper surface of the substrate;
first blocking insulating layers on the charge storage layers, respectively, wherein a first layer of the first blocking insulating layers is directly on an upper surface and a lower surface of the first layer of the charge storage layers and directly on a first side surface of the first layer of the charge storage layers facing the side surface of the first electrode of the gate electrodes, and between the pair of the interlayer insulating layers that are adjacent to each other in the direction perpendicular to the upper surface of the substrate; and
second blocking insulating layers on the gate electrodes, respectively, wherein a first layer of the second blocking insulating layers is on an upper surface, a lower surface, and the side surface of the first electrode of the gate electrodes,
wherein the first side surface of the first layer of the charge storage layers is convex toward the first electrode of the gate electrodes,
wherein the tunneling insulating layer is directly on a second side surface of the first layer of the charge storage layers opposite the first side surface, wherein the first layer of the first blocking insulating layers is in contact with the first layer of the second blocking insulating layers, wherein a height of the first electrode of the gate electrodes in the direction perpendicular to the upper surface of the substrate is greater than a height of the first layer of the charge storage layers in the direction perpendicular to the upper surface of the substrate, and wherein at least one of the side surfaces of the interlayer insulating layers is coplanar with a first portion of the second side surface of the first layer of the charge storage layers, is non-coplanar with a second portion of the second side surface of the first layer of the charge storage layers, and is in direct contact with a portion of the tunneling insulating layer including silicon oxide.

13. The semiconductor device according to claim 12, wherein each of the charge storage layers has a recessed portion contacting the tunneling insulating layer, and wherein the recessed portion of the first layer of the charge storage layers includes the second portion of the second side surface of the first layer of the charge storage layers.

14. The semiconductor device according to claim 12, wherein the first layer of the second blocking insulating layers has an upper surface and a lower surface that are substantially coplanar with an upper surface and a lower surface, respectively, of the first layer of the first blocking insulating layers.

15. The semiconductor device according to claim 12, wherein the first blocking insulating layers and the second blocking insulating layers include different materials.

16. The semiconductor device according to claim 12, wherein a side surface of the first layer of the first blocking insulating layers facing the side surface of the first electrode of the gate electrodes has a convex rounded shape toward the first electrode of the gate electrodes, and a side surface of the first layer of the second blocking insulating layers facing the channel layer has a shape concavely rounded toward the channel layer.

17. A semiconductor device comprising:

gate electrodes spaced apart from each other on a substrate and stacked perpendicularly to an upper surface of the substrate;

interlayer insulating layers alternately stacked with the gate electrodes on the substrate;

a channel layer extending perpendicularly to the upper surface of the substrate;

a tunneling insulating layer between side surfaces of the interlayer insulating layers and the channel layer and extending perpendicularly to the upper surface of the substrate;

charge storage layers between the gate electrodes, respectively, and the tunneling insulating layer, wherein a first layer of the charge storage layers is between a side surface of a first electrode of the gate electrodes and a side surface of the tunneling insulating layer, and between a pair of the interlayer insulating layers that are adjacent to each other in a first direction perpendicular to the upper surface of the substrate;

first blocking insulating layers on the charge storage layers, respectively, wherein a first layer of the first blocking insulating layers is on an upper surface and a lower surface of the first layer of the charge storage layers and on a side surface of the first layer of the charge storage layers facing the side surface of the first electrode of the gate electrodes, and between the pair of the interlayer insulating layers that are adjacent to each other in the first direction; and second blocking insulating layers on the gate electrodes, respectively, wherein a first layer of the second blocking insulating layers is on an upper surface, a lower surface, and the side surface of the first electrode of the gate electrodes, wherein a first portion of the tunneling insulating layer is between the channel layer and the first layer of the first blocking insulating layers, wherein a second portion of the tunneling insulating layer is between the channel layer and the first layer of the charge storage layers, wherein a thickness of the second portion of the tunneling insulating layer in a second direction parallel to the upper surface of the substrate is greater than a thickness of the first portion of the tunneling insulating layer in the second direction, and wherein the upper surface of the first layer of the charge storage layers overlaps the second portion of the tunneling insulating layer in the first direction.

18. The semiconductor device according to claim 17, wherein the first layer of the charge storage layers includes a recessed portion that contacts the tunneling insulating layer, and wherein the second portion of the tunneling insulating layer is between the channel layer and the recessed portion.

19. The semiconductor device according to claim 17, wherein the side surface of the first layer of the charge storage layers is a first side surface, wherein a second side surface of the first layer of the charge storage layers opposite the first side surface faces the tunneling insulating layer, and wherein the upper surface of the first layer of the charge storage layers intersects the second side surface of the first layer of the charge storage layers at substantially a right angle.

20. The semiconductor device according to claim 17, wherein the side surface of the first layer of the charge storage layers is a first side surface, wherein a second side surface of the first layer of the charge storage layers opposite the first side surface faces the tunneling insulating layer, and wherein the second portion of the tunneling insulating layer is directly on the second side surface of the first layer of the charge storage layers.

* * * * *